US012690178B2

(12) United States Patent
    Ikegami

(10) Patent No.: US 12,690,178 B2
(45) Date of Patent: Jul. 21, 2026

(54) POWER CONVERTER

(71) Applicant: FUJI ELECTRIC CO., LTD.,
    Kawasaki (JP)

(72) Inventor: Akira Ikegami, Matsumoto-city (JP)

(73) Assignee: FUJI ELECTRIC CO., LTD.,
    Kawasaki (JP)

( * ) Notice: Subject to any disclaimer, the term of this
    patent is extended or adjusted under 35
    U.S.C. 154(b) by 344 days.

(21) Appl. No.: 18/588,198

(22) Filed: Feb. 27, 2024

(65) Prior Publication Data
    US 2024/0381593 A1     Nov. 14, 2024

(30) Foreign Application Priority Data

May 10, 2023     (JP) ................................. 2023-077881

(51) Int. Cl.
    *H05K 7/20*        (2006.01)
    *H02M 7/00*        (2006.01)
    *H05K 5/02*        (2006.01)
(52) U.S. Cl.
    CPC ........ *H05K 7/20927* (2013.01); *H02M 7/003*
        (2013.01); *H05K 5/0247* (2013.01)
(58) Field of Classification Search
    CPC ........... H05K 7/20927; H05K 7/20254; H05K
        7/20272; H05K 7/20872; H05K 7/2089;
        H05K 5/0217; H05K 7/14322; H05K
        7/209; H05K 1/0203; H05K 5/00; H05K
        7/20845; H02M 7/003; H10W 40/47
    USPC ........................................................ 361/699
    See application file for complete search history.

(56) References Cited

U.S. PATENT DOCUMENTS 5,504,655 A  *  4/1996  Underwood ..........  H02M 7/003
                                                        439/911
8,462,531 B2 *  6/2013  Nishikimi ...........  H02M 7/5387
                                                        361/767
8,848,370 B2 *  9/2014  Shin .........................  H05K 7/20
                                                        361/698

(Continued)

FOREIGN PATENT DOCUMENTS

JP        2010-252460 A    11/2010
JP        2018-67998 A      4/2018

(Continued)

*Primary Examiner* — Mandeep S Buttar

(57) ABSTRACT

A power converter comprises an enclosure case having a
cooling medium flow channel for a cooling medium to flow
through, a power semiconductor module housed in the
enclosure case, a smoothing capacitor and an AC output unit
being electrically connected to the power semiconductor
module and housed in the enclosure case, and an enclosure
cover fixed to a periphery of an opening in an upper portion
of the enclosure case. In the power converter, at least one of
a first electrically connected portion configured to electri-
cally connect a power semiconductor module to a smoothing
capacitor and a plurality of second electrically connected
portions configured to electrically connect the power semi-
conductor module to an AC output unit is thermally con-
nected to an inner wall on a side of a cooling medium flow
channel via cooling terminal blocks, and convex portions for
pressing the first electrically connected portion and the
second electrically connected portions to the cooling termi-
nal blocks are formed in an inner wall of an enclosure cover.

11 Claims, 26 Drawing Sheets

(56)         References Cited

U.S. PATENT DOCUMENTS

| | | | | |
|---|---|---|---|---|
| 8,897,013 B2 * | 11/2014 | Sharaf | ................. | H05K 7/20509 |
| | | | | 361/720 |
| 10,881,023 B2 | 12/2020 | Shintani et al. | | |
| 11,659,684 B2 * | 5/2023 | Hibbard | ............. | H05K 7/20254 |
| | | | | 361/699 |
| 2007/0165376 A1 * | 7/2007 | Bones | ................... | H10W 90/00 |
| | | | | 257/E25.031 |
| 2010/0025126 A1 * | 2/2010 | Nakatsu | ............. | H05K 7/20927 |
| | | | | 361/699 |
| 2010/0097765 A1 * | 4/2010 | Suzuki | .............. | H05K 7/20927 |
| | | | | 361/699 |
| 2011/0261588 A1 * | 10/2011 | Hattori | ................. | F04B 39/121 |
| | | | | 363/13 |
| 2015/0189784 A1 * | 7/2015 | Hirano | ................. | H10W 90/00 |
| | | | | 361/728 |
| 2019/0230812 A1 | 7/2019 | Shintani et al. | | |

FOREIGN PATENT DOCUMENTS

| | | | | |
|---|---|---|---|---|
| JP | 2018186686 | A | * | 11/2018 |
| JP | 6926638 | B2 | | 8/2021 |
| JP | 2022-142594 | A | | 9/2022 |
| WO | 2018/198522 | A1 | | 11/2018 |

* cited by examiner (a)                                             (b)

POWER CONVERTER

CROSS-REFERENCE TO RELATED APPLICATION

This application claims benefit of priority under 35 USC 119 based on Japanese Patent Application No. 2023-077881 filed on May 10, 2023, the entire contents of which are incorporated by reference herein.

TECHNICAL FIELD

The present invention generally relates to power converter, and more particularly to a power converter including a power semiconductor module for electrical power conversion and a cooler for cooling the power semiconductor module.

BACKGROUND ART

As a power converter of this kind, devices disclosed in Patent Document 1 and Patent Document 2 have been known.

The power converter disclosed in Patent Document 1 includes an enclosure in which a cooling medium flow channel is formed, a power semiconductor module for electrical power conversion housed in the enclosure, and a smoothing capacitor and an AC output unit that are connected to the power semiconductor module. Inside the enclosure, a fixed plate is arranged in and fixed to the enclosure in such a way as to cover the power semiconductor module, and a protrusion is formed in the fixed plate. The protrusion of the fixed plate cools a first electrically connected portion where the power semiconductor module is connected to the smoothing capacitor and a second electrically connected portion where the power semiconductor module is connected to the AC output unit, the first electrically connected portion and the second electrically connected portion being heat-generating portions, by pressing the first electrically connected portion and the second electrically connected portion to an inner wall of the enclosure in which the cooling medium flow channel is formed to bring the first electrically connected portion and the second electrically connected portion into close contact with the inner wall of the enclosure.

The power converter disclosed in Patent Document 2 includes a semiconductor module, a capacitor, and a cooler on which the semiconductor module is placed. The semiconductor module has a semiconductor terminal projecting toward the capacitor while the capacitor has a capacitor terminal projecting in such a way as to overlap with the semiconductor terminal. Under the semiconductor terminal and the capacitor terminal that are arranged to be overlapped with each other, a fixing portion of the cooler is provided. By fastening the semiconductor terminal, the capacitor terminal, and the fixing portion with a screw, connected portions of the semiconductor terminal and the capacitor terminal, the connected portions being heat-generating portions, are brought into close contact with the fixing portion and cooled.

CITATION LIST

Patent Document(s)

Patent Document 1: JP 6926638 B
Patent Document 2: JP 2010-252460 A

SUMMARY OF INVENTION

Technical Problem

The fixed plate used in the power converter of Patent Document 1 has a large area that enables the fixed plate to at least cover the first electrically connected portion and the second electrically connected portion. In the enclosure, a control board for driving the semiconductor module is housed. To support the control board with the fixed plate that is arranged between the semiconductor module and the control board, the fixed plate requires an opening for a control pin of the power semiconductor module to pass through. Thus, the fixed plate of Patent Document 1 has a complex shape in which the protrusion for pressing the first electrically connected portion and the second electrically connected portion and the opening for the control pin of the power semiconductor module to pass through are formed, and the fixed plate requires a large area, which leads to a problem in a production cost.

The power converter of Patent Document 2 requires an operation to fasten the semiconductor terminal of the semiconductor module and the capacitor terminal of the capacitor to the fixing portion of the cooler with a screw in order to bring the semiconductor terminal and the capacitor terminal into close contact with the fixing portion, which leads to a problem in assembly operations.

Therefore, it is an object of the present invention to provide a power converter that can reliably cool heat-generating portions of the smoothing capacitor and the AC output unit that are electrically connected to the power semiconductor module while reducing the production cost and assembly operations.

Solution to Problem

To achieve the object described above, a power converter according to one aspect of the present invention includes: an enclosure case in which a cooling medium flow channel for a cooling medium to flow through is formed inside, the enclosure case including an opening in an upper portion; a power semiconductor module housed in the enclosure case in such a way as to be in close contact with an inner wall of the enclosure case on the side of the cooling medium flow channel; a smoothing capacitor and an AC output unit being electrically connected to the power semiconductor module and housed in the enclosure case; and an enclosure cover fixed to a periphery of the opening in the upper portion of the enclosure case in such a way as to cover or face to the power semiconductor module, the smoothing capacitor, and the AC output unit and configured to form an enclosure, wherein at least one of a plurality of first electrically connected portions configured to electrically connect the power semiconductor module to the smoothing capacitor and a plurality of second electrically connected portions configured to electrically connect the power semiconductor module to the AC output unit is thermally connected to the inner wall on the side of the cooling medium flow channel via a cooling terminal block and convex portions configured to press the plurality of first electrically connected portions and the plurality of second electrically connected portions to the cooling terminal block are formed in an inner wall of the enclosure cover.

Advantageous Effects of Invention

The power converter of the present invention can reliably cool heat-generating portions of the smoothing capacitor and the AC output unit that are electrically connected to the power semiconductor module while reducing a production cost and assembly operations.

BRIEF DESCRIPTION OF DRAWINGS

FIG. 8 is a perspective view of a power semiconductor module constituting the power converter according to the first embodiment illustrating an upper side of the power semiconductor module.

FIG. 23 is a cross-sectional view of a power converter according to a second embodiment of the present invention.

FIG. 24 is a cross-sectional view of a power converter according to a third embodiment of the present invention.

DESCRIPTION OF EMBODIMENTS

With reference to drawings, first to sixth embodiments of the present invention will be described. In the description of the drawings below, same or like elements are denoted by the same or like reference signs. It should be noted that the drawings are schematic and relations between thicknesses and two-dimensional dimensions, ratios among thicknesses of layers may be different from actual ones. Thus, specific thicknesses and dimensions should be determined in consideration of the following descriptions. It goes without saying that relations between corresponding dimensions and ratios between dimensions may be different between the drawings.

The first to sixth embodiments to be described below are intended to exemplify a device and a method for embodying the technical idea of the present invention, and the technical idea of the present invention does not limit materials, shapes, structures, arrangements, and the like of components to those described below. Various modifications may be made to the technical idea of the present invention within the technical scope defined by the claims.

Modes for carrying out the present invention (referred to as embodiments hereinafter) will be described below in detail with reference to the drawings. It should be noted that directional terms such as "upper", "lower", "bottom", "front", "back", or "horizontal" in the following description are used referring to directions in the attached drawings.

[Power Converter According to First Embodiment]

A power converter of a first embodiment according to an aspect of the present invention will be described below with reference to the drawings as appropriate.

Figure 1:
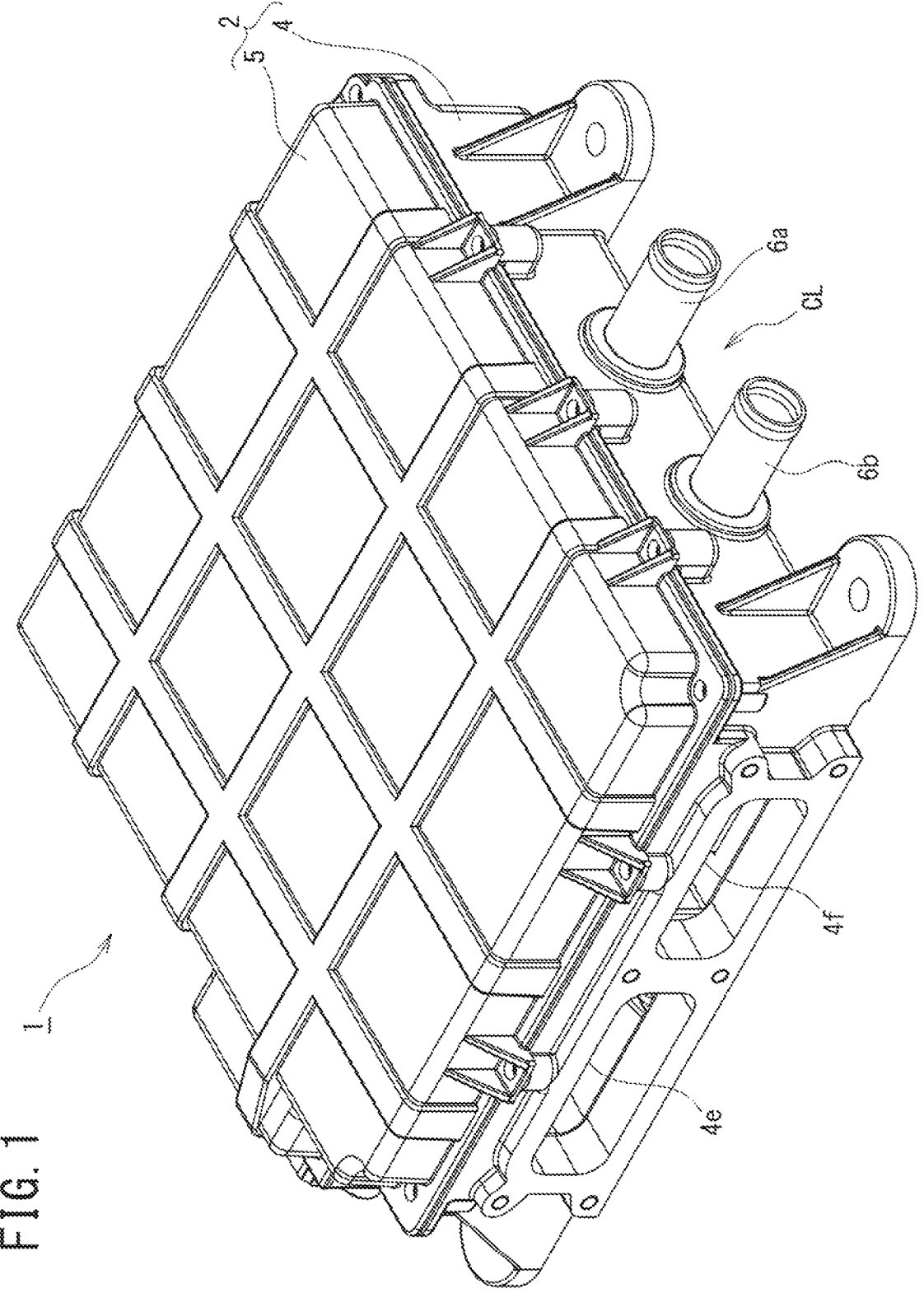
FIG. 1 is a perspective view of a power converter according to a first embodiment of the present invention illustrating an exterior appearance of the power converter.

As illustrated in FIG. 1, a power converter 1 according to the first embodiment of the present invention includes an enclosure 2 and a cooling water circulation unit CL provided on a bottom of the enclosure 2. The enclosure 2 consists of an enclosure case 4 and an enclosure cover 5.

The enclosure case 4 connects to a cooling water supply pipe 6*a* and a cooling water discharging pipe 6*b*, and the enclosure case 4 has an external input connecting port 4*e* and an external output connecting port 4*f* that are open.

Figure 2:
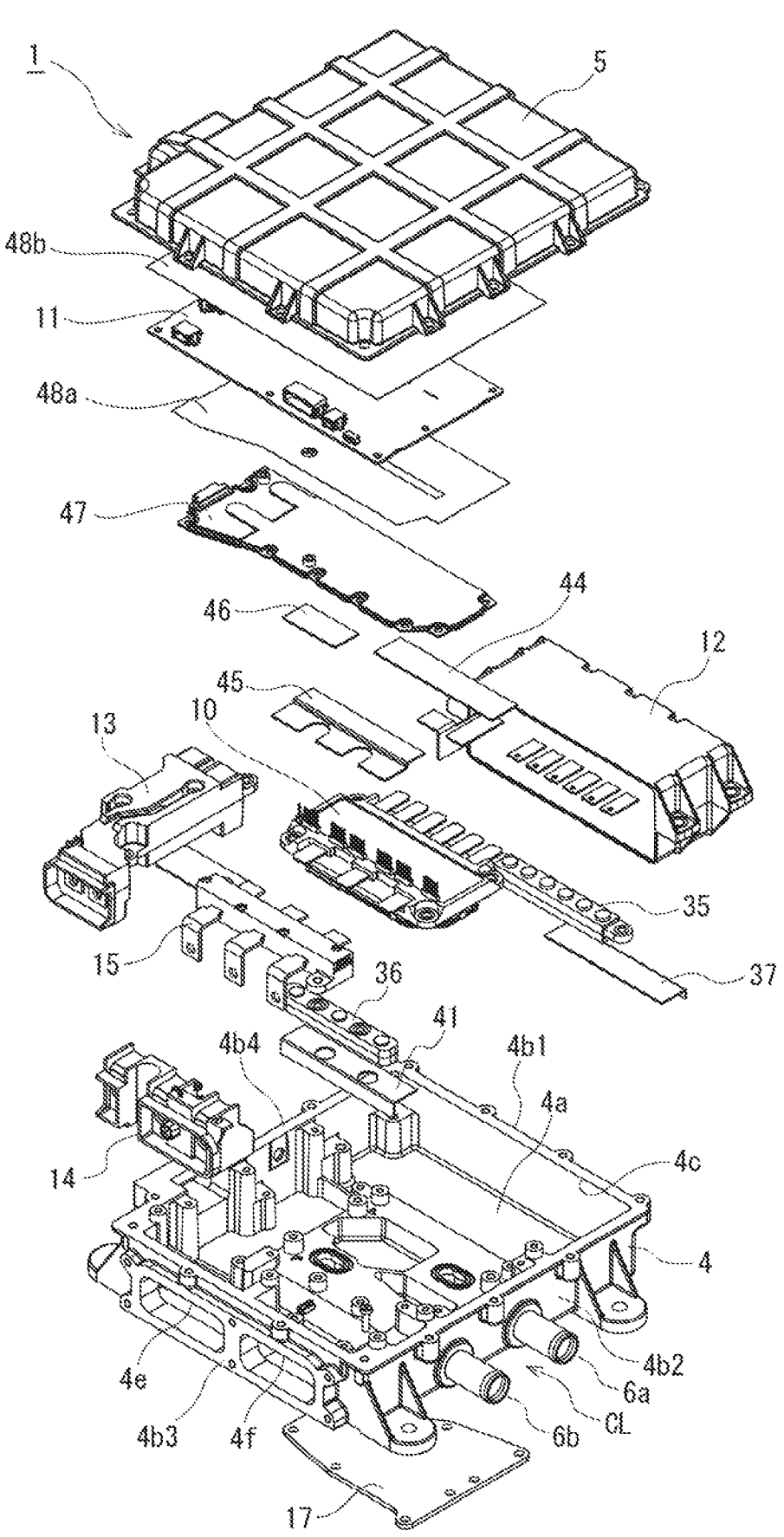
FIG. 2 is a perspective view of components constituting the power converter according to the first embodiment.

In the enclosure 2, as illustrated in FIG. 2, an insulated gate bipolar transistor (IGBT) module 10, a control circuit board 11 on which a driver circuit for driving the IGBT module 10 and the like are mounted, a smoothing capacitor 12, a DC input connector 13, an AC output connector 14, and a current detector 15 are housed. The power semiconductor module according to the present invention corresponds to the IGBT module 10 while the AC output unit according to the present invention corresponds to the current detector 15.

The enclosure case 4 and the enclosure cover 5 that constitute the enclosure 2 are casts made of aluminum or an aluminum alloy.

Figure 3:
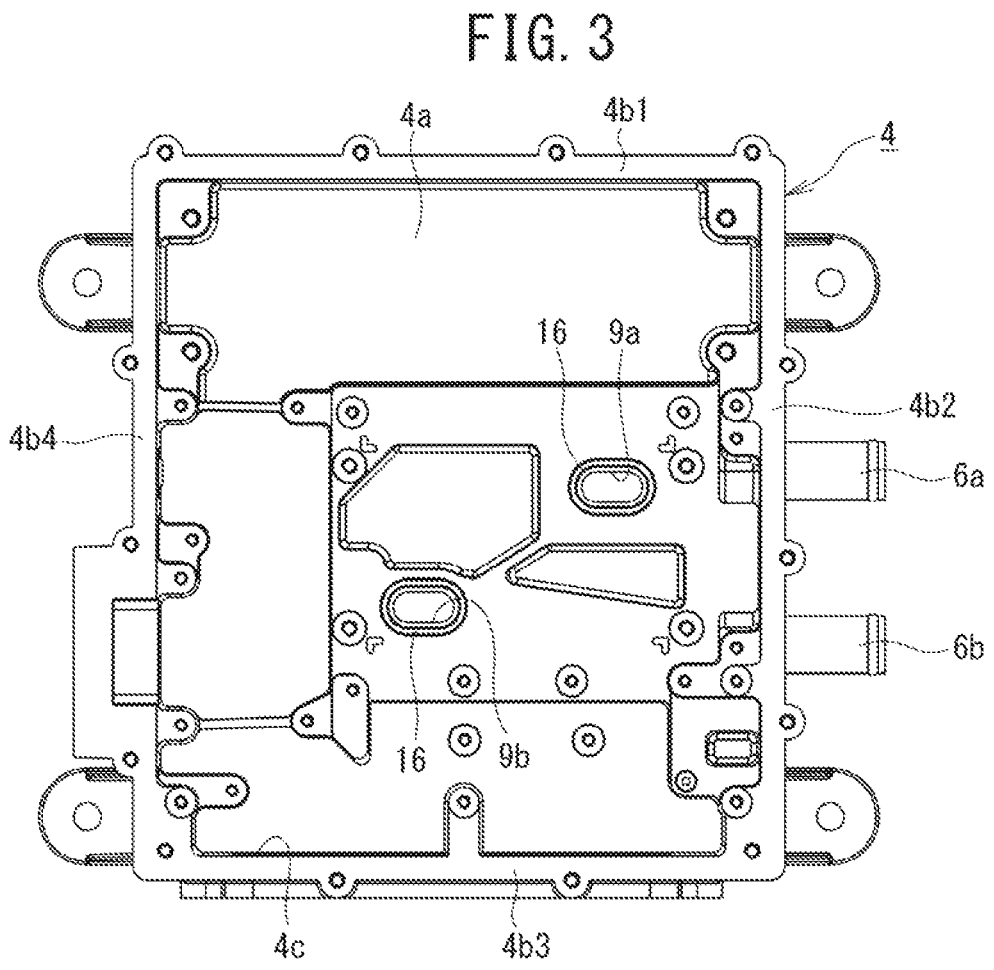
FIG. 3 is a diagram illustrating an inside of a bottom wall of an enclosure of the first embodiment.
Figure 4:
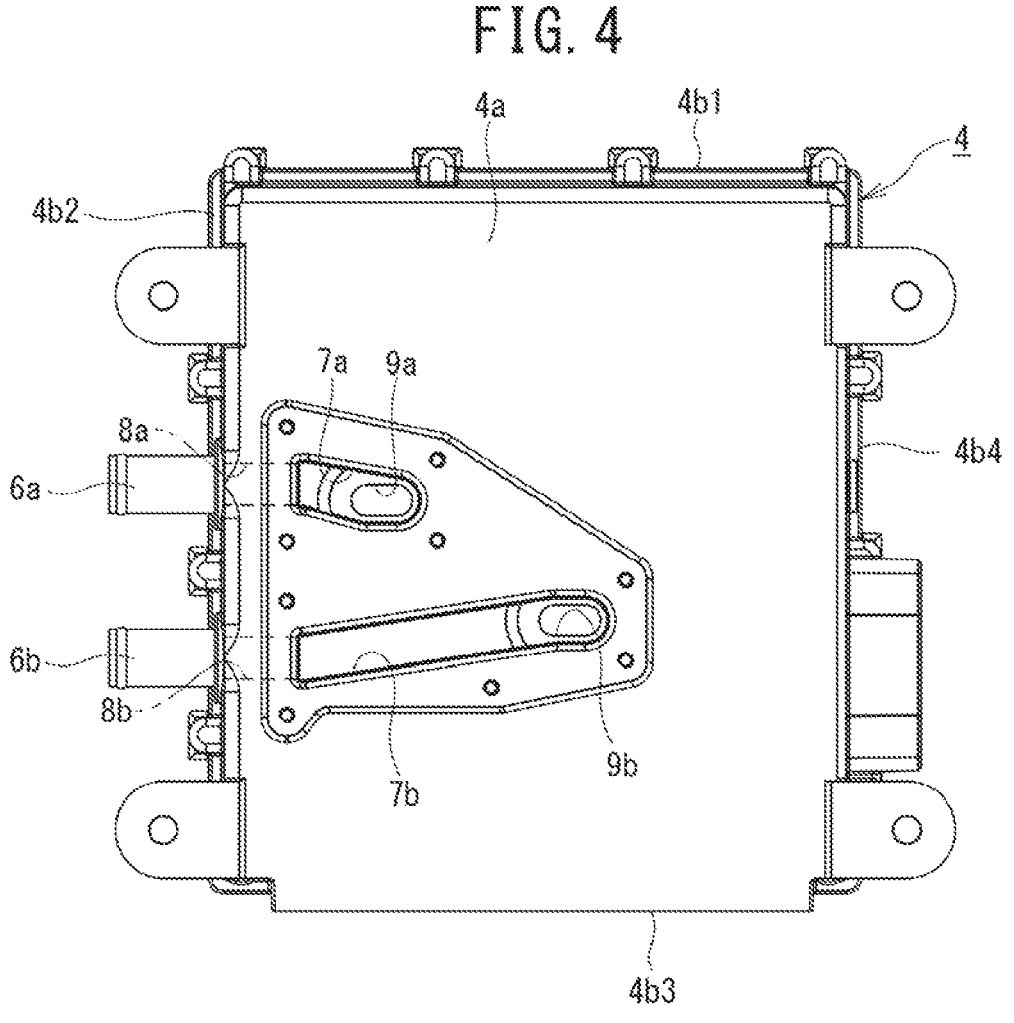
FIG. 4 is a diagram illustrating an outside of the bottom wall of the enclosure of the first embodiment.

FIG. 3 illustrates an inside of the enclosure case 4 and FIG. 4 illustrates an outside of the enclosure case 4.

As illustrated in FIG. 3, the enclosure case 4 includes a bottom wall 4*a* of a rectangular shape, first to fourth sidewalls 4*b*1 to 4*b*4 that rise from the bottom wall 4*a* along the entire perimeter of the bottom wall 4*a*, and an opening 4*c* that opens at upper ends of the first to fourth sidewalls 4*b*1 to 4*b*4. The inner wall according to the present invention corresponds to the bottom wall 4*a*.

The cooling water supply pipe 6*a* and the cooling water discharging pipe 6*b* are connected to the second sidewall 4*b*2 by press-fitting or welding, and the external input connecting port 4*e* and the external output connecting port 4*f* are formed in the third sidewall 4*b*3.

In the external side of the bottom wall 4*a* of the enclosure case 4, an inflow slot 7*a* that extends in a horizontal direction in FIG. 4 and an outflow slot 7*b* that is longer than the inflow slot 7*a* and that extends in the horizontal direction are formed. The inflow slot 7*a* communicates with the cooling water supply pipe 6*a* at the left side via a communication channel 8*a* while the outflow slot 7*b* communicates with the cooling water discharging pipe 6*b* at the left side via a communication channel 8*b*. Further, an inflow opening 9*a* penetrating through the bottom wall 4*a* is formed on the right side of the inflow slot 7*a* and an outflow opening 9*b* penetrating through the bottom wall 4*a* is formed on the right side of the outflow slot 7*b*.

Figure 5:
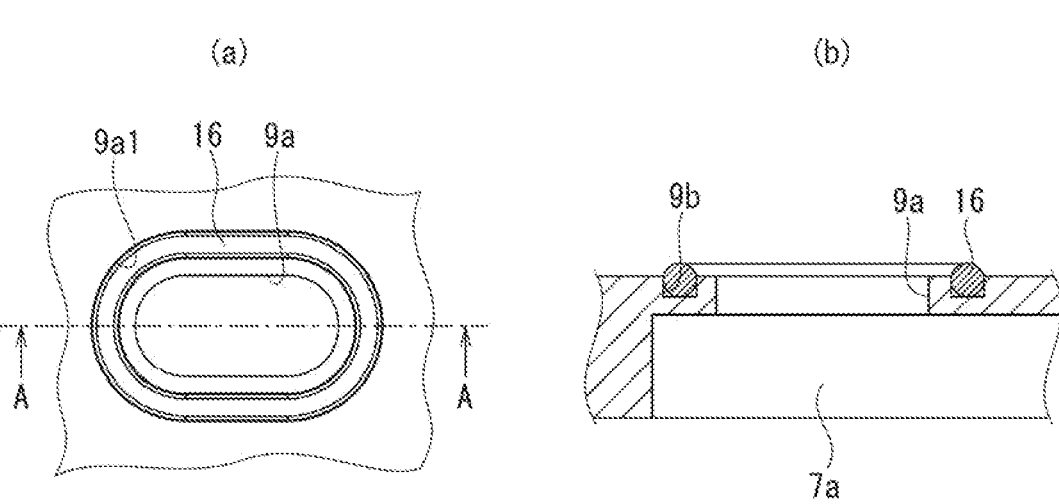
FIG. 5, part(a), is an enlarged view of a principal part of the bottom wall of the enclosure illustrated in FIG. 3 while FIG. 5, part (b), is a cross-sectional view of the principal part illustrated in FIG. 5, part (a), taken along line A-A.

As illustrated in FIGS. 5A and 5B, a circumferential groove 9*al* is formed on the outer side of the inflow opening 9*a* and an O-ring 16 is placed in the circumferential groove 9*a*1. A circumferential groove (not illustrated) is also formed on the outer side of the outflow opening 9*b* and an O-ring 16 is also placed in the circumferential groove.

Two or more of these O-rings may be placed with adding more circumferential grooves as necessary.

Figure 6:
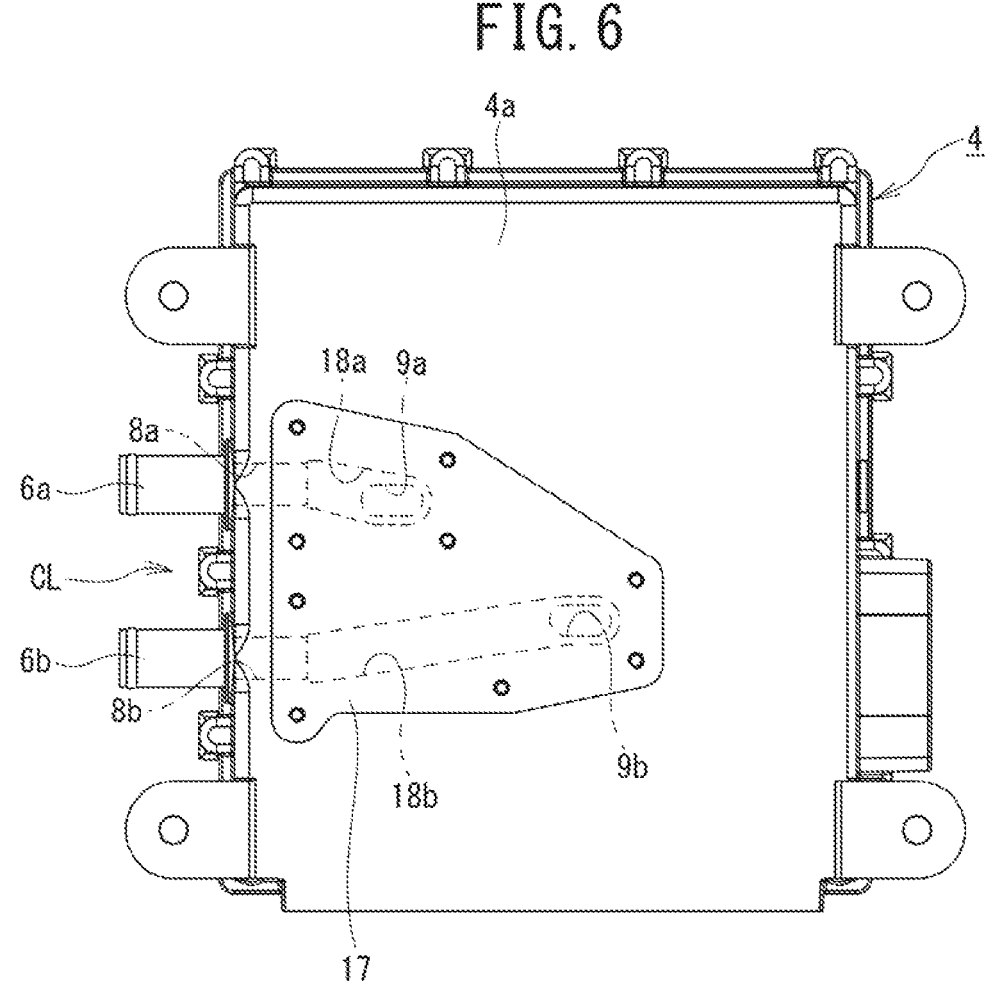
FIG. 6 is a diagram illustrating a state in which a flow channel cover is attached to the outside of the bottom wall of an enclosure case of the first embodiment.

As illustrated in FIG. 6, a flow channel cover 17 is fixed to the external side of the bottom wall 4*a* of the enclosure case 4 in such a way as to occlude openings of the inflow slot 7*a* and the outflow slot 7*b*, thereby forming an inflow flow channel 18*a* communicating with the cooling water supply pipe 6*a* and the inflow opening 9*a* and an outflow flow channel 18*b* communicating with the cooling water discharging pipe 6*b* and the outflow opening 9*b*.

Thus, the cooling water circulation unit CL described above consists of the cooling water supply pipe 6*a*, the communication channel 8*a*, the inflow flow channel 18*a*, the inflow opening 9*a*, the cooling water discharging pipe 6*b*, the communication channel 8*b*, the outflow flow channel 18*b*, and the outflow opening 9*b*.

Figure 7:
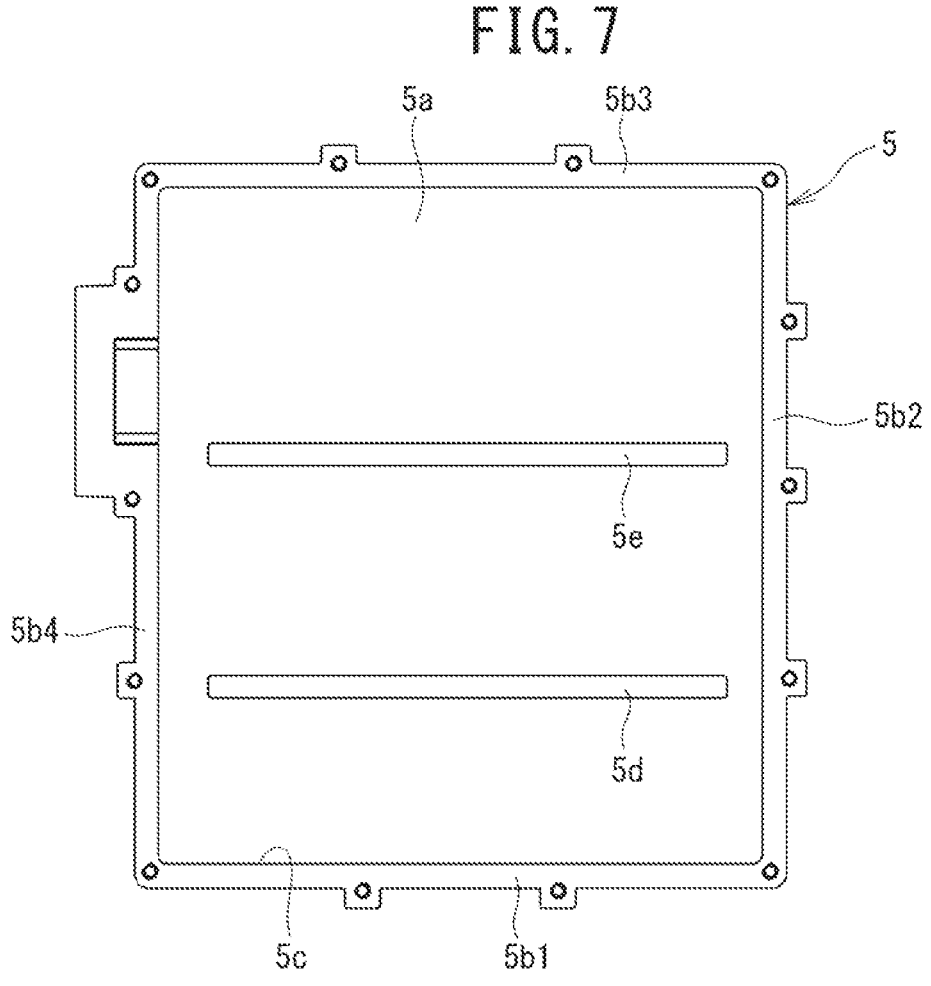
FIG. 7 is a diagram illustrating a convex portion formed in a top wall of an enclosure cover of the first embodiment.

FIG. 7 illustrates an inside of the enclosure cover 5. The enclosure cover 5 includes a top wall 5*a* of a rectangular shape, first to fourth sidewalls 5*b*1 to 5*b*4 that rise from the top wall 5*a* along the entire perimeter of the top wall 5*a*, and an opening 5*c* that opens at upper ends of the first to fourth sidewalls 5*b*1 to 5*b*4.

On an inner portion of the top wall 5*a*, two ridges, i.e., a first protruding ridge 5*d* and a second protruding ridge 5*e* are integrally formed in such a way as to project from the opening 5*c*. These two ridges, that is, the first protruding ridge 5*d* and the second protruding ridge 5*e* project with the same height from one end to the other end in a longitudinal direction and extend in parallel to each other. The convex portions according to the present invention correspond to the first protruding ridge 5*d* and the second protruding ridge 5*e*. The forms of the first protruding ridge 5*d* and the second protruding ridge 5*e* are not limited to a single protruding ridge as illustrated in FIG. 7, and may be a plurality of ridges arranged side by side.

Figure 8:
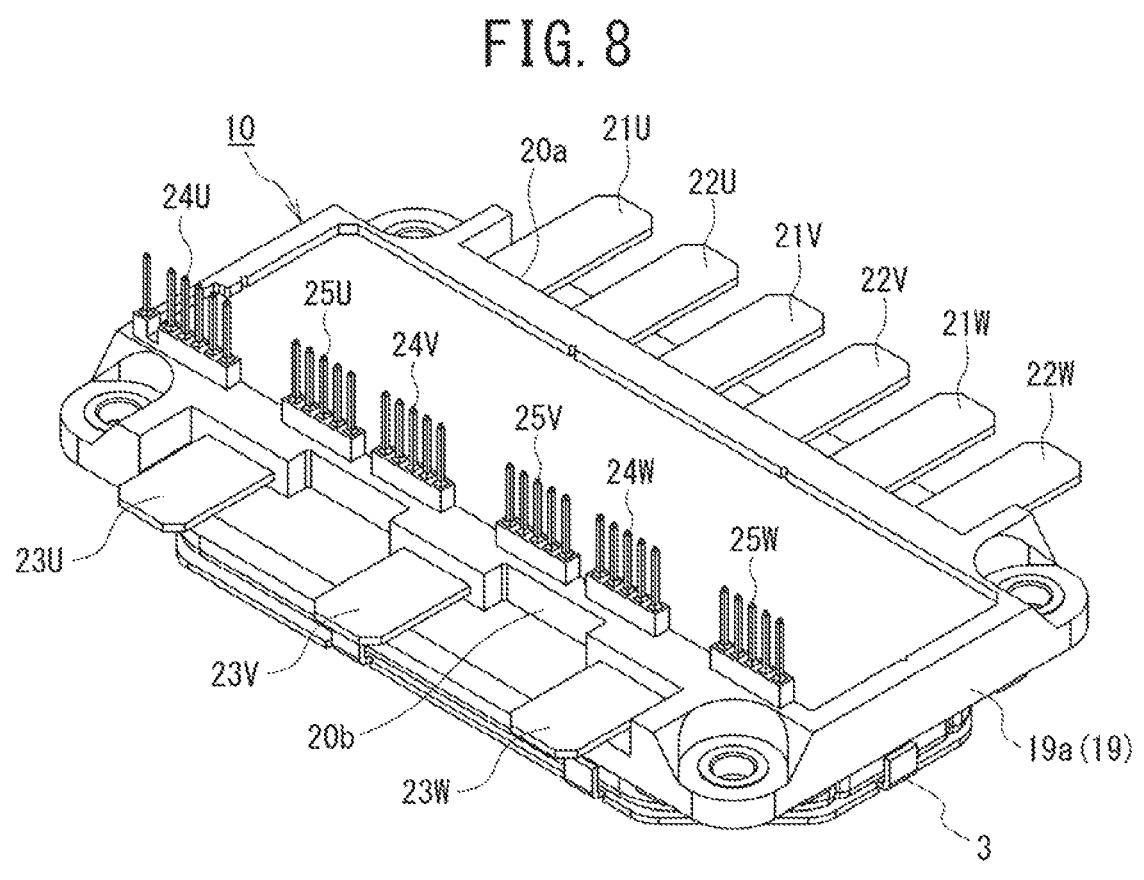
Figure 9:
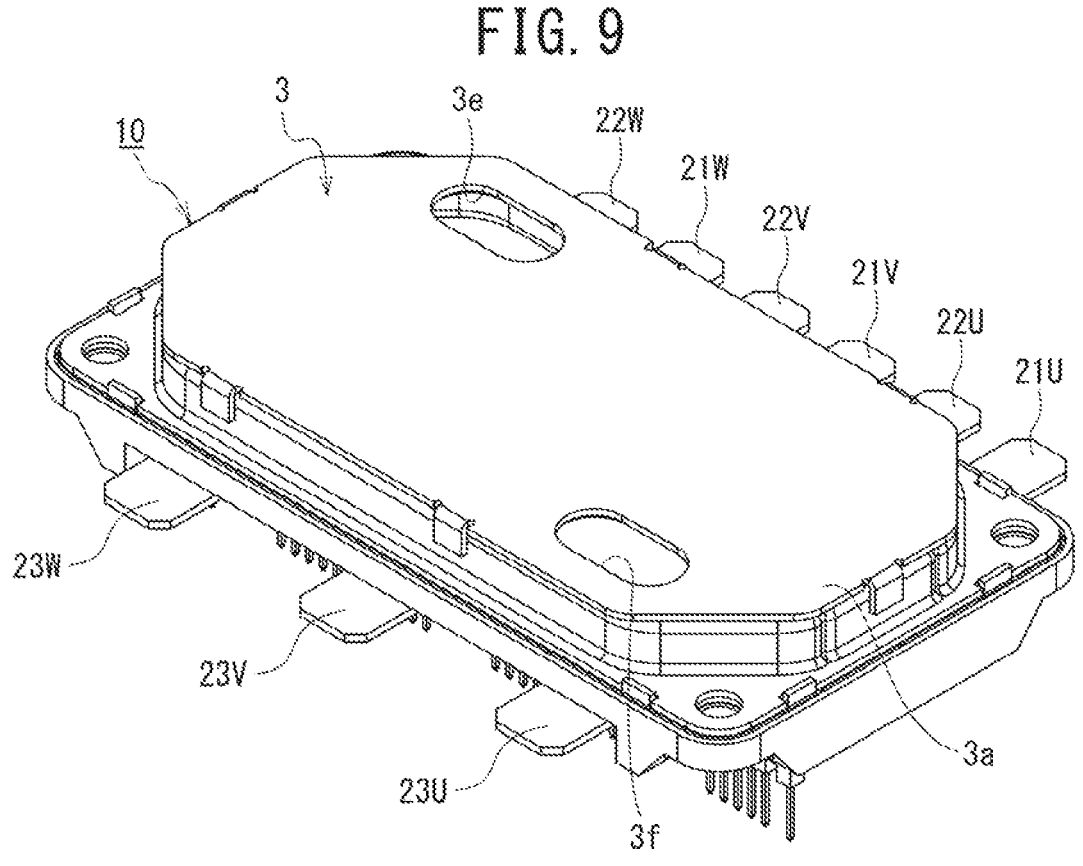
FIG. 9 is a perspective view of the power semiconductor module according to the first embodiment illustrating a back side of the power semiconductor module.

FIG. 8 and FIG. 9 illustrate the IGBT module 10 and the IGBT module 10 includes a module main unit 19 and a cooler 3 that is integrated with the module main unit 19 and connected to the cooling water circulation unit CL provided on the enclosure 2 to circulate cooling water.

The module main unit 19 includes a rectangular parallel-epiped resin package 19*a* and a metal base plate (not illustrated) arranged on an underside of the resin package 19*a*, and the cooler 3 is integrated with the module main unit 19 on the side of the metal base plate.

In the resin package 19*a*, upper arm semiconductor chips, upper arm wiring patterns, conductor plates for upper arm wiring, lower arm semiconductor chips, lower arm wiring patterns, conductor plates for lower arm wiring, wiring patterns for grounding, and the like of three unillustrated IGBTs are embedded, and the upper arm semiconductor chips and the lower arm semiconductor chips are in contact with the metal base plate.

In the resin package 19*a*, plate-shaped positive-side terminals 21U, 21V, 21W and plate-shaped negative-side terminals 22U, 22V, 22W are provided in a line in such a way that these terminals project from one side face 20*a* of the resin package 19*a* in a longitudinal direction and end portions of these terminals in the plate width direction face against each other. Further, plate-shaped output terminals 23U, 23V, 23W are provided in a line in such a way that these terminals project from the other side face 20*b* of the resin package 19*a* in the longitudinal direction and end portions of these terminals in the plate width direction face against each other.

The positive-side terminals 21U, 21V, 21W are connected to collectors of the upper arm semiconductor chips via the upper arm wiring patterns and the negative-side terminals 22U, 22V, 22W are connected to emitters of the lower arm semiconductor chips via the wiring patterns for grounding and the conductor plates for lower arm wiring while the output terminals 23U, 23V, 23W are connected to emitters of the upper arm semiconductor chips and collectors of the lower arm semiconductor chips via the lower arm wiring patterns and the conductor plates for upper arm wiring.

On an upper face of the resin package 19*a*, a plurality of upper arm lead frames 24U, 24V, 24W to be connected to a plurality of upper arm control electrodes and a plurality of lower arm lead frames 25U, 25V, 25W to be connected to a plurality of lower arm control electrodes are provided in such a way as to project upward. The control pin according to the present invention corresponds to the upper arm lead frames 24U, 24V, 24W and the lower arm lead frames 25U, 25V, 25W.

As illustrated in FIG. 9, the cooler 3 is joined to the underside of the resin package 19*a*.

In a bottom wall 3*a* of the cooler 3, an inflow opening 3*e* to be connected to the inflow opening 9*a* of the enclosure case 4 and an outflow opening 3*f* to be connected to the outflow opening 9*b* of the enclosure case 4 are formed.

Figure 10:
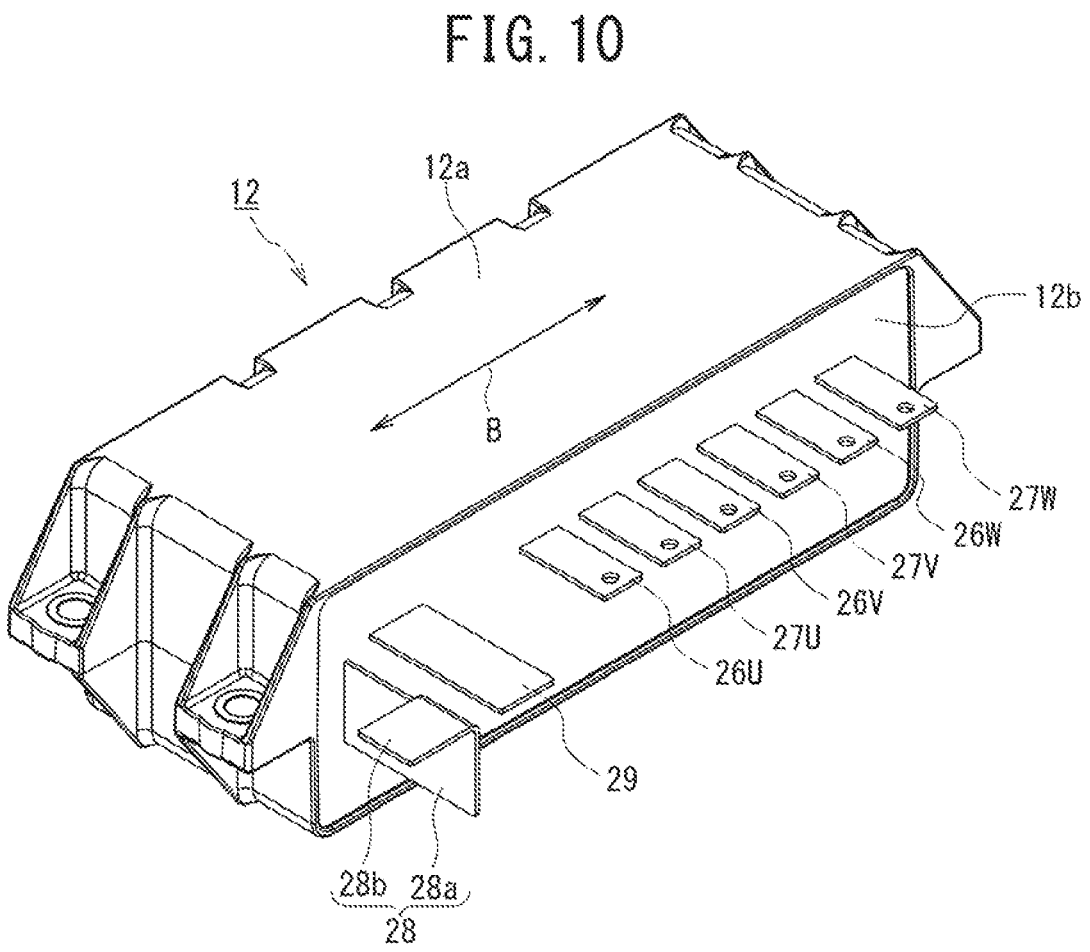
FIG. 10 is a perspective view illustrating a smoothing capacitor constituting the power converter according to the first embodiment.

The smoothing capacitor 12 is a device that smooths a DC voltage input from the DC input connector 13, and includes, as illustrated in FIG. 10, a substantially rectangular paral-lelepiped capacitor main body 12*a* and a plurality of terminals that project from a side face 12b extending in a longitudinal direction (the direction of arrow B) of the capacitor main body 12a.

The plurality of terminals of the smoothing capacitor 12 are provided at positions to the right side of the side face 12b, and plate-shaped positive-side output terminals 26U, 26V, 26W and plate-shaped negative-side output terminals 27U, 27V, 27W are provided in a line along the longitudinal direction of the capacitor main body 12a in such a way that these terminals project from the side face 12b and end portions of these terminals in the plate width direction face against each other.

Figure 11:
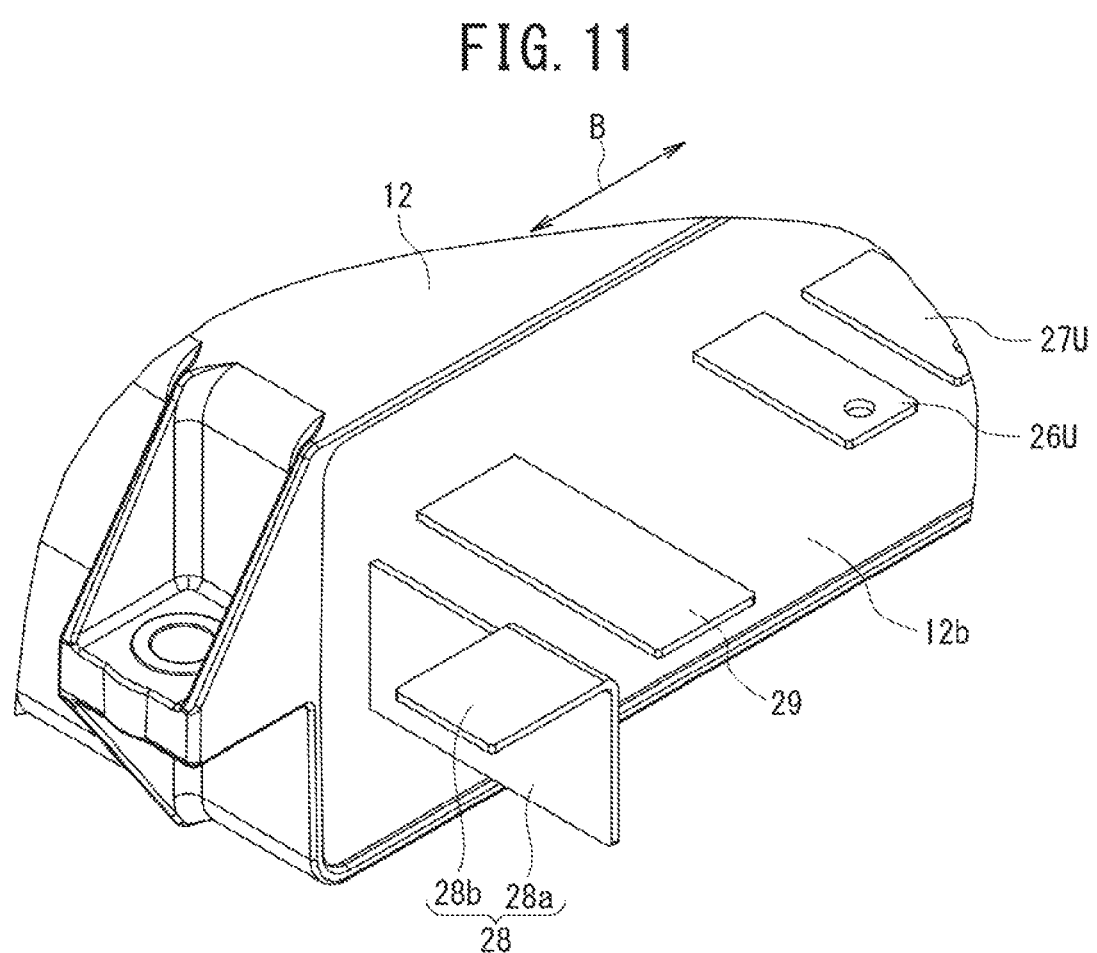
FIG. 11 is a diagram illustrating a principal part of the smoothing capacitor of the first embodiment.

At positions to the left side of the side face 12b, as illustrated in FIG. 10 and FIG. 11, a positive-side input terminal 28 and a negative-side input terminal 29 are provided in such a way as to project from the side face 12b.

The negative-side input terminal 29 is a plate-shaped projecting terminal with the planar direction thereof extending in a longitudinal direction thereof.

The positive-side input terminal 28 is a terminal that includes a plate-shaped base 28a that projects from the side face 12b with the planar direction thereof extending in a direction perpendicular to the longitudinal direction of the capacitor main body 12a and a connecting portion 28b formed by bending the base 28a at a distal end in the longitudinal direction of the capacitor main body 12a.

Figure 12:
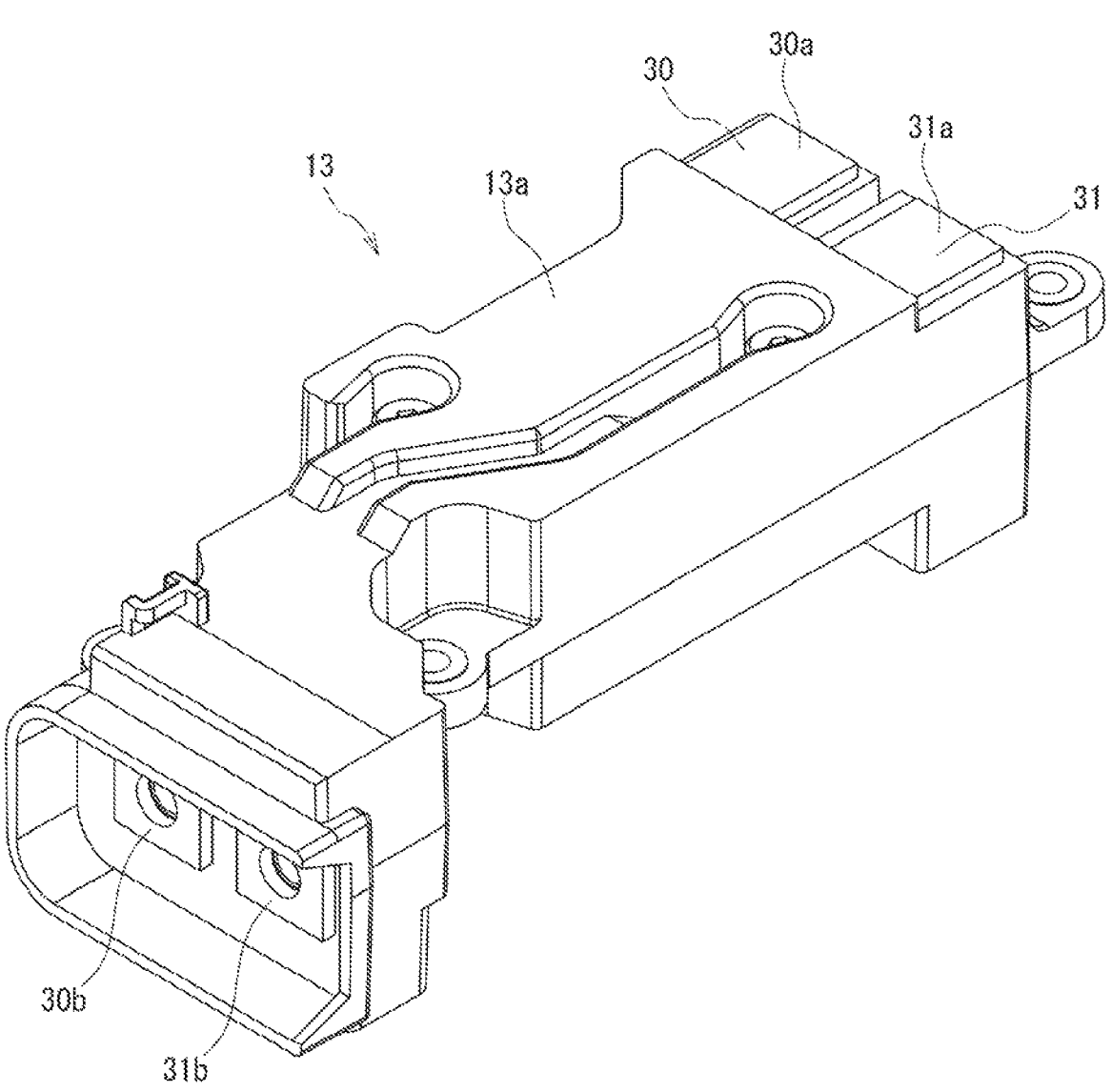
FIG. 12 is a perspective view illustrating a DC input connector constituting the power converter according to the first embodiment.

FIG. 12 illustrates the DC input connector 13, and the DC input connector 13 includes an input connector main body 13a made by molding a resin and two busbars, i.e., a plate-shaped positive-side busbar 30 and a plate-shaped negative-side busbar 31 that are placed in the input connector main body 13a and that extend in a longitudinal direction of the input connector main body 13a.

One end of the positive-side busbar 30 serves as a capacitor connecting terminal 30a to be connected to the positive-side input terminal 28 of the smoothing capacitor 12 and the other end serves as an external input connecting terminal 30b to be connected to a positive-side terminal of an external input converter (not illustrated). Further, one end of the negative-side busbar 31 serves as a capacitor connecting terminal 31a to be connected to the negative-side input terminal 29 of the smoothing capacitor 12 and the other end serves as an external input connecting terminal 31b to be connected to a negative-side terminal of the external input converter.

Figure 13:
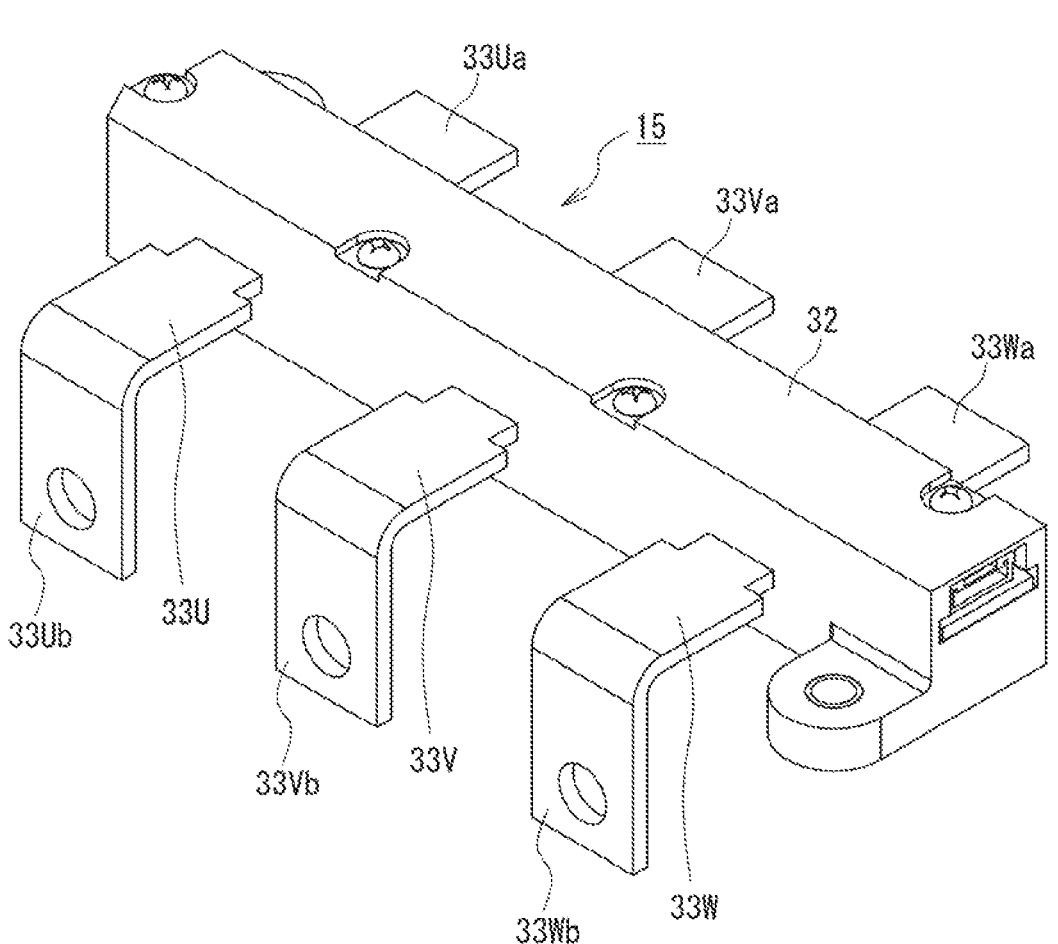
FIG. 13 is a perspective view illustrating a current detector constituting the power converter according to the first embodiment.

The current detector 15 is a device that detects an alternating current output from the IGBT module 10, and the current detector 15 includes, as illustrated in FIG. 13, a rectangular parallelepiped detector main body 32 and three plate-shaped detector busbars 33U, 33V, 33W that are spaced from each other in a longitudinal direction of the detector main body 32.

One end of the detector busbar 33U serves as an IGBT connecting terminal 33Ua to be connected to the output terminal 23U of the IGBT module 10 while the other end of the detector busbar 33U serves as an output terminal 33Ub of the AC output connector 14. One end of the detector busbar 33V serves as an IGBT connecting terminal 33Va to be connected to the output terminal 23V of the IGBT module 10 while the other end of the detector busbar 33V serves as an output terminal 33Vb of the AC output connector 14. Further, one end of the detector busbar 33W serves as an IGBT connecting terminal 33Wa to be connected to the output terminal 23W of the IGBT module 10 while the other end of the detector busbar 33W serves as an output terminal 33Wb of the AC output connector 14.

Figure 14:
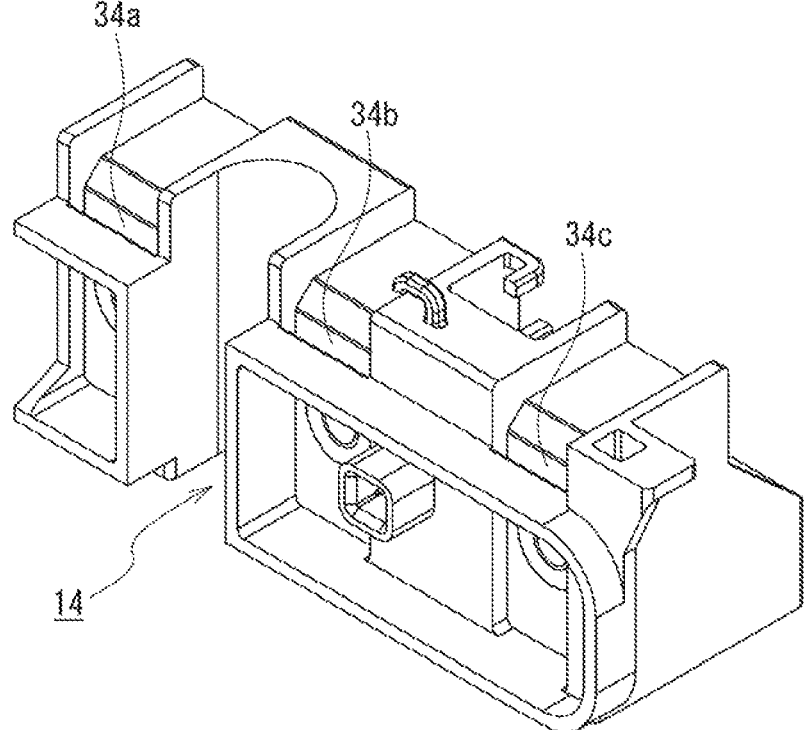
FIG. 14 is a perspective view illustrating an AC output connector constituting the power converter according to the first embodiment.

FIG. 14 illustrates the AC output connector 14, in which mounting holes 34a, 34b, 34c into which the output terminals 33Ub, 33Vb, 33Wb of the detector busbars 33U, 33V, 33W are inserted from above to mount the current detector 15 are formed.

Next, assembly of the power converter 1 according to the first embodiment will be described.

Figure 15:
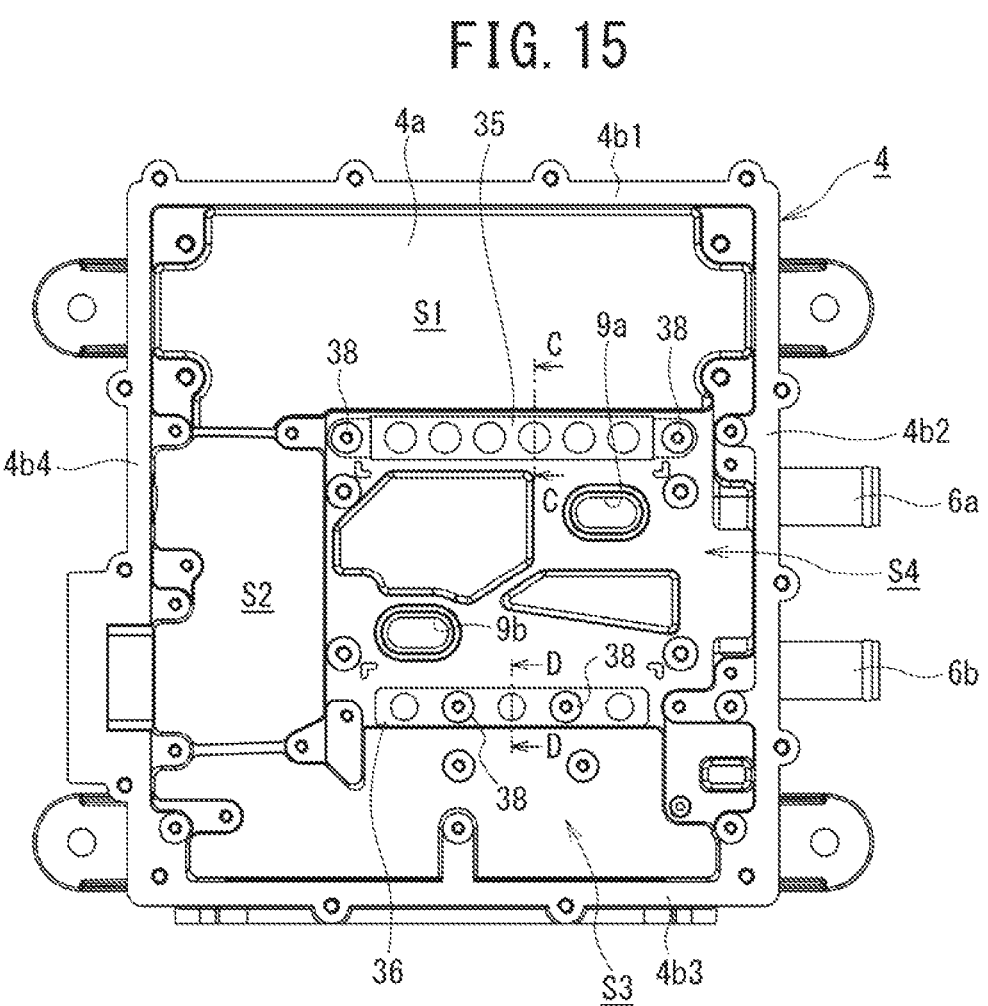
FIG. 15 is a diagram illustrating a state in which cooling terminal blocks are attached to the inside of the bottom wall of the enclosure of the first embodiment.

First, storage spaces for components to be housed in the enclosure case 4 are illustrated in FIG. 15.

As illustrated in FIG. 15, the enclosure case 4 includes a first storage space S1 that houses the smoothing capacitor 12, a second storage space S2 that houses the DC input connector 13, a third storage space S3 that houses the current detector 15 and the AC output connector, and a fourth storage space S4 that houses the IGBT module 10.

A cooling terminal block 35 is fixed to the bottom wall 4a between the first storage space S1 and the fourth storage space S4 and a cooling terminal block 36 is fixed to the bottom wall 4a between the third storage space S3 and the fourth storage space S4.

Figure 16:
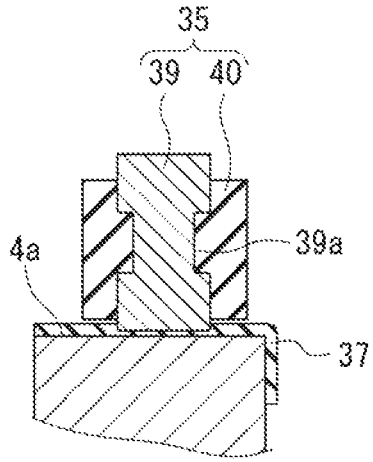
FIG. 16 is a cross-sectional diagram of an assembly illustrated in FIG. 15 taken along line C-C.

The cooling terminal block 35 is a member that is placed on the bottom wall 4a, as illustrated in FIG. 15 and FIG. 16, with an electrically insulating heat-transfer sheet 37 in between and fixed to the bottom wall 4a at opposite ends in a longitudinal direction thereof with fixing screws 38. The cooling terminal block 35 is made of brass having good heat conductivity and includes six cooling terminals 39 of a round bar shape and a terminal block main body 40 that is made of a thermoplastic resin by insert-molding the cooling terminals 39 arranged at a predetermined interval in such a way that upper and lower end faces of the cooling terminals 39 are exposed to the outside.

Figure 17:
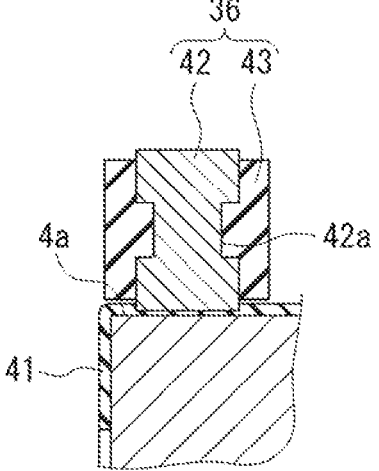
FIG. 17 is a cross-sectional diagram of the assembly illustrated in FIG. 15 taken along line D-D.

The cooling terminal block 36 is also a member that is placed on the bottom wall 4a, as illustrated in FIG. 15 and FIG. 17, with an electrically insulating heat-transfer sheet 41 in between and fixed to the bottom wall 4a at separated positions in the longitudinal direction thereof with the fixing screws 38. The cooling terminal block 36 includes three cooling terminals 42 of a round bar shape that is made of brass and a terminal block main body 43 that is made of a thermoplastic resin by insert-molding the cooling terminals 42 arranged at a predetermined interval in such a way that upper and lower end faces of the cooling terminals 42 are exposed to the outside.

In the cooling terminals 39 and 42 of the cooling terminal blocks 35 and 36, diameter-reduced portions 39a and 42a are respectively formed in the middle of the cooling terminals 39 and 42 in an axial direction in order to prevent the cooling terminals 39 and 42 from falling off from the terminal block main body 40 and the terminal block main body 43.

Figure 18:
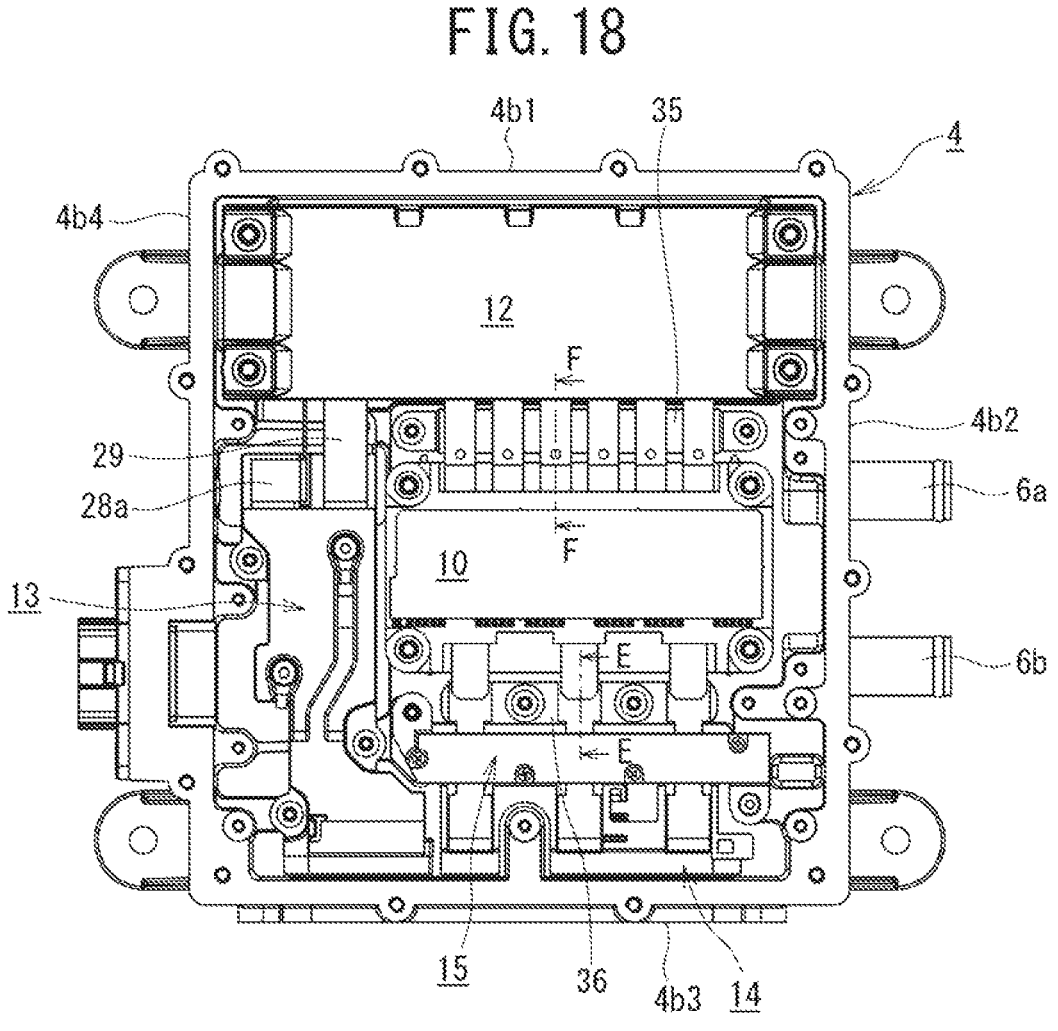
FIG. 18 is a diagram illustrating the enclosure of the first embodiment in which key components of the power converter are arranged.

As illustrated in FIG. 18, in the enclosure case 4, the DC input connector 13 is housed in the second storage space S2, the AC output connector 14 and the current detector 15 are housed in the third storage space S3, the IGBT module 10 is housed in the fourth storage space S4, and the smoothing capacitor 12 is housed in the first storage space S1, and these components are fixed to the bottom wall 4a.

It is to be noted that the external input connecting terminals 30b and 31b of the DC input connector 13 are located inside the external input connecting port 4e of the enclosure case 4 illustrated in FIG. 1 and the output terminals 33Ub, 33Vb, 33Wb of the current detector 15 integrally mounted to the AC output connector 14 is located inside the external output connecting port 4f of the enclosure case 4.

When the IGBT module 10 is placed in the fourth storage space S4 and fixed, cooling water supplied from the cooling water supply pipe 6a of the cooling water circulation unit CL passes through the inflow openings 3e and 9a to be supplied into the cooler 3 of the IGBT module 10, and cooling water discharged from the cooler 3 is allowed to pass through the outflow openings 3f and 9b to be discharged to the outside from the cooling water discharging pipe 6b.

Then, as illustrated in FIG. 18, the capacitor connecting terminal 30a of the DC input connector 13 that projects toward the smoothing capacitor 12 overlaps with the connecting portion 28b of the positive-side input terminal 28 of the smoothing capacitor 12 and the capacitor connecting terminal 31a of the DC input connector 13 also overlaps with the negative-side input terminal 29 of the smoothing capacitor 12; thus, electrical connections are achieved by welding these overlapping portions. Note that a method for joining these overlapping portions is not limited to welding, and ultrasonic sound waves, for example, may be employed.

Figure 19:
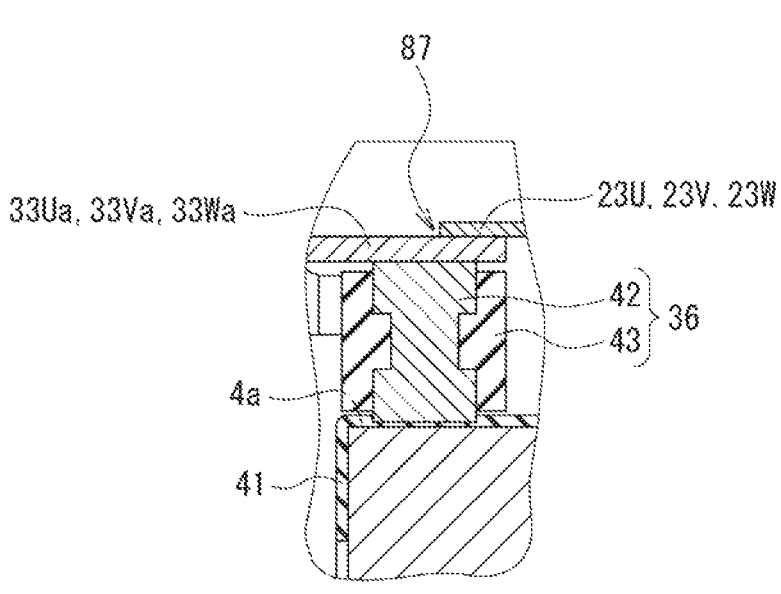
FIG. 19 is a diagram illustrating the cooling terminal block arranged at a portion where the power semiconductor module according to the first embodiment and an AC output unit are electrically connected.

As illustrated in FIG. 19, the IGBT connecting terminals 33Ua, 33Va, 33Wa of the current detector 15 also overlap with the output terminals 23U, 23V, 23W of the IGBT module 10; thus, electrical connections are achieved by welding these overlapping portions. Undersides of these electrically connected portions thermally contact the cooling terminals 42 of the cooling terminal block 36. The second electrically connected portion according to the present invention corresponds to connected portions of the IGBT connecting terminals 33Ua, 33Va, 33Wa of the current detector 15 and the output terminals 23U, 23V, 23W of the IGBT module 10, and the second electrically connected portion is referred to as a second electrically connected portion 87 in the following description.

Figure 20:
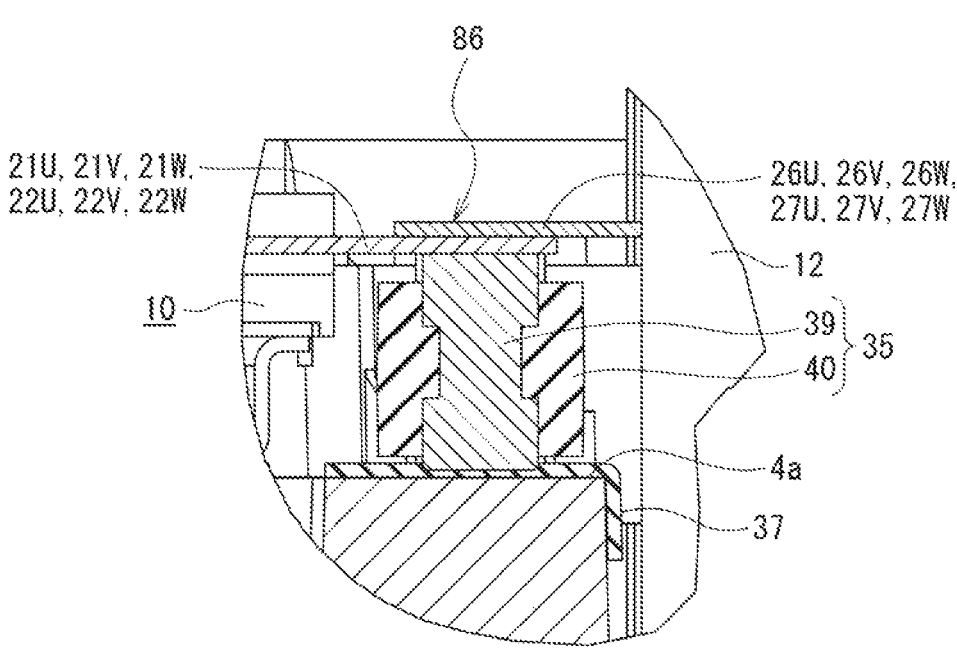
FIG. 20 is a diagram illustrating the cooling terminal block arranged at a portion where the power semiconductor module according to the first embodiment and the smoothing capacitor are electrically connected.

Further, as illustrated in FIG. 20, the positive-side output terminals 26U, 26V, 26W and the negative-side output terminals 27U, 27V, 27W of the smoothing capacitor 12 also overlap with the positive-side terminals 21U, 21V, 21W and the negative-side terminals 22U, 22V, 22W of the IGBT module 10, respectively; thus, electrical connections are achieved by welding these overlapping portions. Undersides of these electrically connected portions thermally contact the cooling terminals 39 of the cooling terminal block 35. The first electrically connected portion according to the present invention corresponds to connected portions of the positive-side output terminals 26U, 26V, 26W of the smoothing capacitor 12 and the positive-side terminal 21U, 21V, 21W of the IGBT module 10 and connected portions of the negative-side output terminal 27U, 27V, 27W of the smoothing capacitor 12 and the negative-side terminal 22U, 22V, 22W of the IGBT module 10, and the first electrically connected portion is referred to as a first electrically connected portion 86 in the following description.

Figure 21:
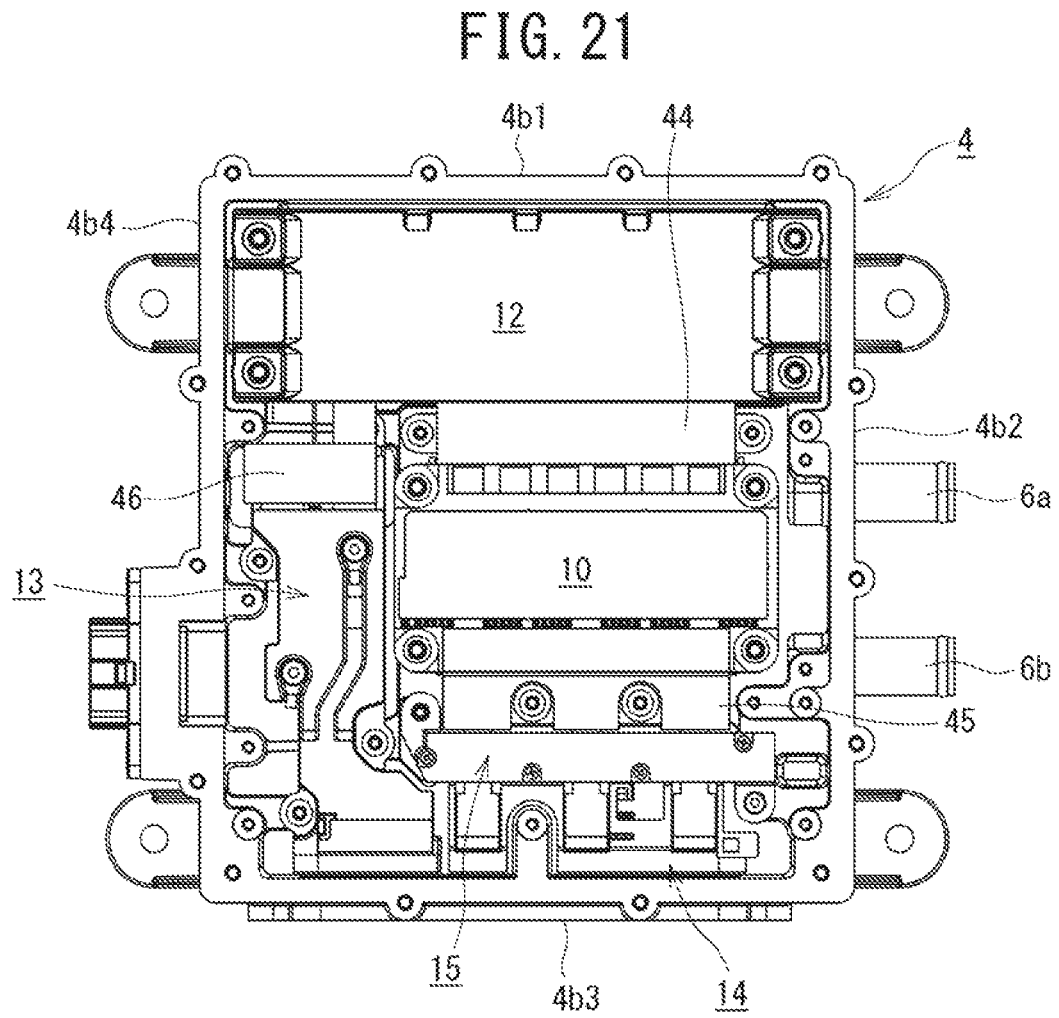
FIG. 21 is a diagram illustrating the enclosure of the first embodiment in which a resin sheet is arranged over the key components of the power converter arranged in the enclosure.

Then, as illustrated in FIG. 21, upsides of the electrically connected portions of the IGBT module 10 and the smoothing capacitor 12, upsides of the electrically connected portions of the current detector 15 and the IGBT module 10, and upsides of the electrically connected portions of the DC input connector 13 and the smoothing capacitor 12 are respectively covered by resin sheets 44, 45, 46.

Figure 22:
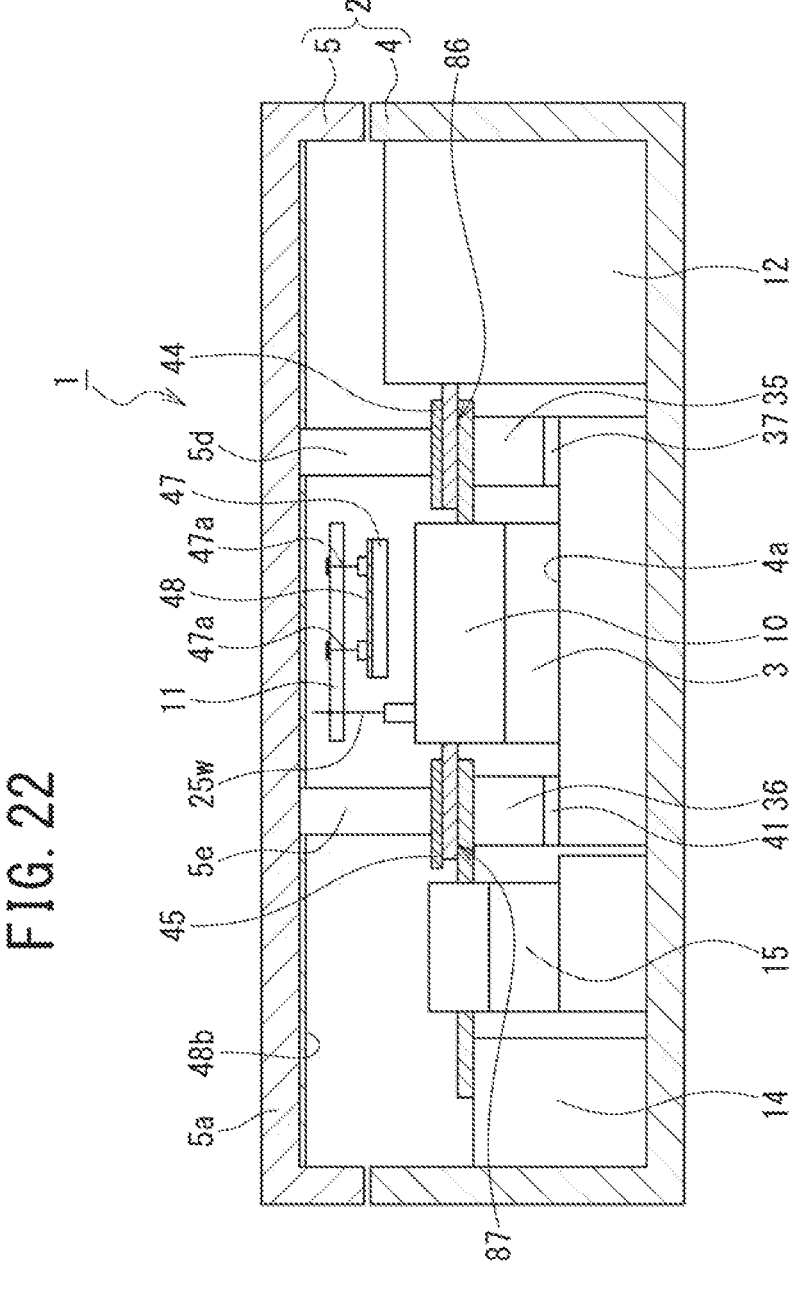
FIG. 22 is a cross-sectional view of the power converter according to the first embodiment.

Subsequently, as illustrated in FIG. 22, a fixed plate 47 that covers or faces to an upside of the IGBT module 10 is fixed to the enclosure case 4, and an insulating paper 48a illustrated in FIG. 2 is applied on an upper face of the fixed plate 47. Then, being supported by board supporting members 47a projecting upward from the fixed plate 47, the control circuit board 11 is arranged above the fixed plate 47.

The fixed plate 47 is a member that is formed by covering substantially whole areas of a metal plate with a thermoplastic resin, and is shaped in such a way as to cover a portion of the IGBT module 10. The upper arm lead frames 24U, 24V, 24W and the lower arm lead frames 25U, 25V, 25W that project from an upper face of the IGBT module 10 pass outside the fixed plate 47 and are inserted into through-holes with lands (not illustrated) of the control circuit board 11. Then, the lead frames and associated through-holes are soldered.

Subsequently, as illustrated in FIG. 22, an insulating paper 48b (see FIG. 2) is applied to an inner wall of the top wall 5a of the enclosure cover 5, and a periphery of the opening 5c of the enclosure cover 5 is fixed to a periphery of the opening 4c of the enclosure case 4 to form the enclosure 2. Thus, the enclosure 2 in which the IGBT module 10, the control circuit board 11, the smoothing capacitor 12, the DC input connector 13, the AC output connector 14, and the current detector 15 are housed is liquid-tightly sealed against outside air.

When the enclosure cover 5 is fixed to the enclosure case 4 in this state, as illustrated in FIG. 22, a distal end of the first protruding ridge 5d projecting from the top wall 5a of the enclosure cover 5 presses the first electrically connected portion 86 of the IGBT module 10 and the smoothing capacitor 12 to the cooling terminal block 35 through the resin sheet 44. In addition, by fixing the enclosure cover 5 to the enclosure case 4, a distal end of the second protruding ridge 5e projecting from the top wall 5a of the enclosure cover 5 presses the second electrically connected portion 87 of the IGBT module 10 and the current detector 15 to the cooling terminal block 36 through the resin sheet 45.

In the power converter 1 having the configuration as described above, the smoothing capacitor 12 to which DC power is supplied from the external input converter (not illustrated) through the DC input connector 13 smooths the input DC voltage and outputs the resultant DC voltage to the IGBT module 10. When a gating signal, for example, that is composed of pulse-width modulation signals is supplied from the control circuit board 11 to the IGBT module 10 and on-off control is performed on six IGBTs using gating signals with phase differences of 120 degrees, the IGBT module 10 outputs a three-phase alternating current having U-phase, V-phase, and W-phase to a load through the current detector 15 and the AC output connector 14.

When the six IGBTs in the IGBT module 10 are operating, the upper arm semiconductor chips and the lower arm semiconductor chips of the six IGBTs embedded in the resin package 19a generate heat.

When the upper arm semiconductor chips and the lower arm semiconductor chips embedded in the resin package 19a of the IGBT module 10 generate heat, the smoothing capacitor 12 that smooths DC voltage and the current detector 15 that detects three-phase alternating current output from the IGBT module 10 also generate heat.

The heat generated by the upper arm semiconductor chips and the lower arm semiconductor chips of the IGBT module 10 is thermally conducted to the cooler 3 that is integrated with the module main unit 19 of the IGBT module 10.

The heat conducted to the cooler 3 of the IGBT module 10 is transferred by the cooling water circulating in the cooler 3, and the upper arm semiconductor chips and the lower arm semiconductor chips of the IGBT module 10 will be efficiently cooled.

Further, the cooling terminal block 35 is arranged in such a way that undersides of the first electrically connected portions 86 of the IGBT module 10 and the smoothing capacitor 12, which are pressed by the first protruding ridge 5d projecting from the top wall 5a of the enclosure cover 5 toward the bottom wall 4a, are in thermal contact with upper ends of the cooling terminals 39 as illustrated in FIG. 20. Therefore, the heat of the first electrically connected portions 86 is thermally conducted to the bottom wall 4a of the enclosure case 4 through the heat-transfer sheet 37 arranged under the cooling terminals 39.

The cooling terminal block 36 is also arranged in such a way that undersides of the second electrically connected portions 87 of the IGBT module 10 and the current detector 15, which are pressed by the second protruding ridge 5e projecting from the top wall 5a of the enclosure cover 5 toward the bottom wall 4a, are in thermal contact with upper ends of the cooling terminals 42 as illustrated in FIG. 19. Therefore, the heat of the second electrically connected portions 87 is thermally conducted to the bottom wall 4a of the enclosure case 4 through the heat-transfer sheet 41 arranged under the cooling terminals 42.

In the bottom wall 4a of the enclosure case 4, the inflow flow channel 18a and the outflow flow channel 18b of the cooling water circulation unit CL in which the cooling water circulates are formed as illustrated in FIG. 6, therefore, heat radiation performance of the bottom wall 4a is high. Accordingly, the heat conducted through the cooling terminal blocks 35 and 36 is transferred to the bottom wall 4a having high heat radiation performance, and the terminals that connect the IGBT module 10 to the smoothing capacitor 12 and the terminal that connect the IGBT module 10 to the current detector 15 are efficiently cooled.

Next, an effect of the power converter 1 according to the first embodiment will be described.

When the first electrically connected portions of the IGBT module 10 and the smoothing capacitor 12 and the second electrically connected portions of the IGBT module 10 and the current detector 15 generate heat due to power dissipation, the cooling terminal blocks 35 and 36 that are respectively arranged under the first electrically connected portions and the second electrically connected portions conduct the heat to the bottom wall 4a. Since the first protruding ridge 5d of the enclosure cover 5 presses the first electrically connected portions 86 to the cooling terminal block 35 and the second protruding ridge 5e of the enclosure cover 5 presses the second electrically connected portions 87 to the cooling terminal block 36, the first electrically connected portions 86 are in close contact with the cooling terminal block 35 and the second electrically connected portions 87 are in close contact with the cooling terminal block 36. This improves heat conduction from the first electrically connected portions 86 to the cooling terminal block 35 and heat conduction from the second electrically connected portions 87 to the cooling terminal block 36, thereby enabling efficient cooling of the first electrically connected portions 86 and the second electrically connected portions 87.

The fixed plate 47 that is fixed to the enclosure case 4 and that supports the control circuit board 11 while covering the IGBT module 10 is a member having a small area that is arranged in such a way as to cover a portion of the IGBT module 10. The upper arm lead frames 24U, 24V, 24W and the lower arm lead frames 25U, 25V, 25W of the IGBT module 10 that are connected to the control circuit board 11 pass outside the fixed plate 47 and extend to the control circuit board 11, and therefore, the fixed plate 47 does not require an opening for the aforementioned lead frames to pass through. Accordingly, the fixed plate 47 may be formed of a simple small plate having a small area, enabling a production cost to be reduced. Further, since the upper arm lead frames 24U, 24V, 24W and the lower arm lead frames 25U, 25V, 25W do not pass through the fixed plate 47, possibility of bending the aforementioned lead frames can be reduced.

Furthermore, as illustrated in FIG. 18, the DC input connector 13 and the IGBT module 10 that are housed in the enclosure case 4 are arranged side by side in a longitudinal direction of the smoothing capacitor 12 in such a way that their combined dimension in the longitudinal direction is equal to or less than the dimension of the smoothing capacitor 12 in the longitudinal direction. The current detector 15 is arranged side by side with the IGBT module 10 in a direction perpendicular to the longitudinal direction of the smoothing capacitor 12. Thus, by arranging other components in such a way that the combined dimension of other components in the longitudinal direction of the smoothing capacitor 12, which is the largest of the components constituting the power converter 1, the area of the bottom wall 4a can be reduced.

[Power Converter According to Second Embodiment]

Figure 23:
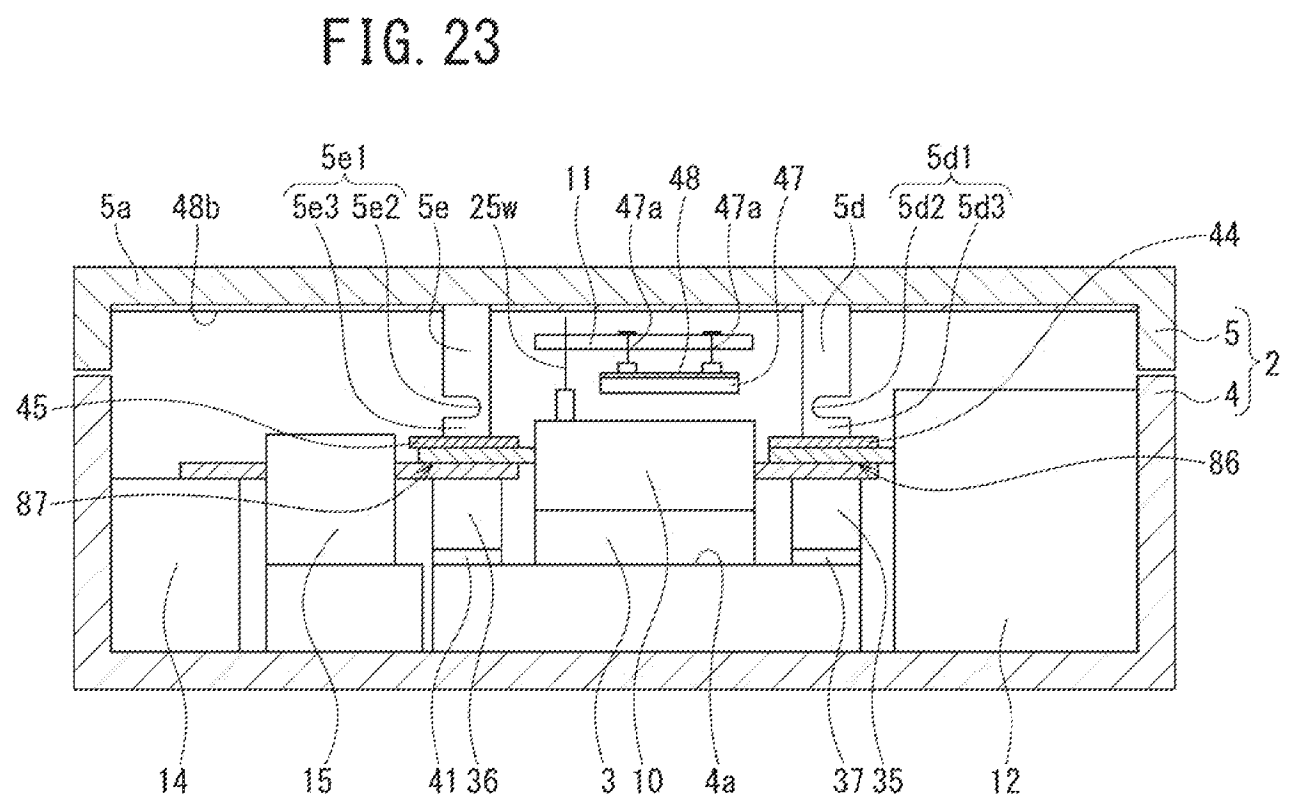

FIG. 23 illustrates a principal part of a power converter according to a second embodiment. Note that the same reference signs denote the same components as those in the first embodiment, and corresponding descriptions thereof are omitted.

In the power converter according to the present embodiment, a first elastic pressing portion 5d1 is formed at an end portion of the first protruding ridge 5d projecting from the top wall 5a of the enclosure cover 5. The first elastic pressing portion 5d1 consists of an elastically deformable thinned-out portion 5d2 that is thinned out compared to the proximal side of the first protruding ridge 5d and an abutting portion 5d3 formed distal to the thinned-out portion 5d2. Further, a second elastic pressing portion 5e1 is formed at an end portion of the second protruding ridge 5e. The second elastic pressing portion 5e1 consists of an elastically deformable thinned-out portion 5e2 that is thinned out compared to the proximal side of the second protruding ridge 5e and an abutting portion 5e3 formed distal to the thinned-out portion 5e2. The elastic pressing portion according to the present invention corresponds to the first elastic pressing portion 5d1 and the second elastic pressing portion 5e1.

In the present embodiment, when the enclosure cover 5 is fixed to the enclosure case 4, the abutting portion 5d3 of the first elastic pressing portion 5d1 of the first protruding ridge 5d presses the first electrically connected portion 86 through the resin sheet 44 to the cooling terminal block 35. In this case, as the abutting portion 5d3 presses the first electrically connected portion 86, the thinned-out portion 5d2 is elastically deformed and an elastic restoring force generated by the elastically deformed thinned-out portion 5d2 is applied to the abutting portion 5d3, causing the pressing force to be increased.

The abutting portion 5e3 of the second elastic pressing portion 5e1 of the second protruding ridge 5e also presses the second electrically connected portion 87 through the resin sheet 45 to the cooling terminal block 36. As the abutting portion 5e3 presses the second electrically connected portion 87, the thinned-out portion 5e2 is elastically deformed and an elastic restoring force generated by the elastically deformed thinned-out portion 5e2 is applied to the abutting portion 5e3, causing the pressing force to be increased. According to the present embodiment, by forming the first elastic pressing portion 5d1 and the second elastic pressing portion 5e1 respectively in the first protruding ridge 5d and the second protruding ridge 5e, the pressing forces on the cooling terminal blocks 35 and 36 are increased, and the first electrically connected portion 86 and the second electrically connected portion 87 are respectively brought into closer contact with the cooling terminal block 35 and the cooling terminal block 36, thereby enabling efficiency of cooling the first electrically connected portion 86 and the second electrically connected portion 87 to be increased.

Although, in the present embodiment, the first elastic pressing portion 5*d*1 is formed at the end portion of the first protruding ridge 5*d* and the second elastic pressing portion 5*e*1 is formed at the end portion of the second protruding ridge 5*e*, the elastic pressing portion according to the present invention may be formed by joining an elastic member made of, for example, rubber at a flat end of the first protruding ridge 5*d* and at a flat end of the second protruding ridge 5*e*. In this case, as long as insulation can be secured with the elastic member made of, for example, rubber, the resin sheets 44 and 45 do not have to be provided.

[Power Converter According to Third Embodiment]

Figure 24:
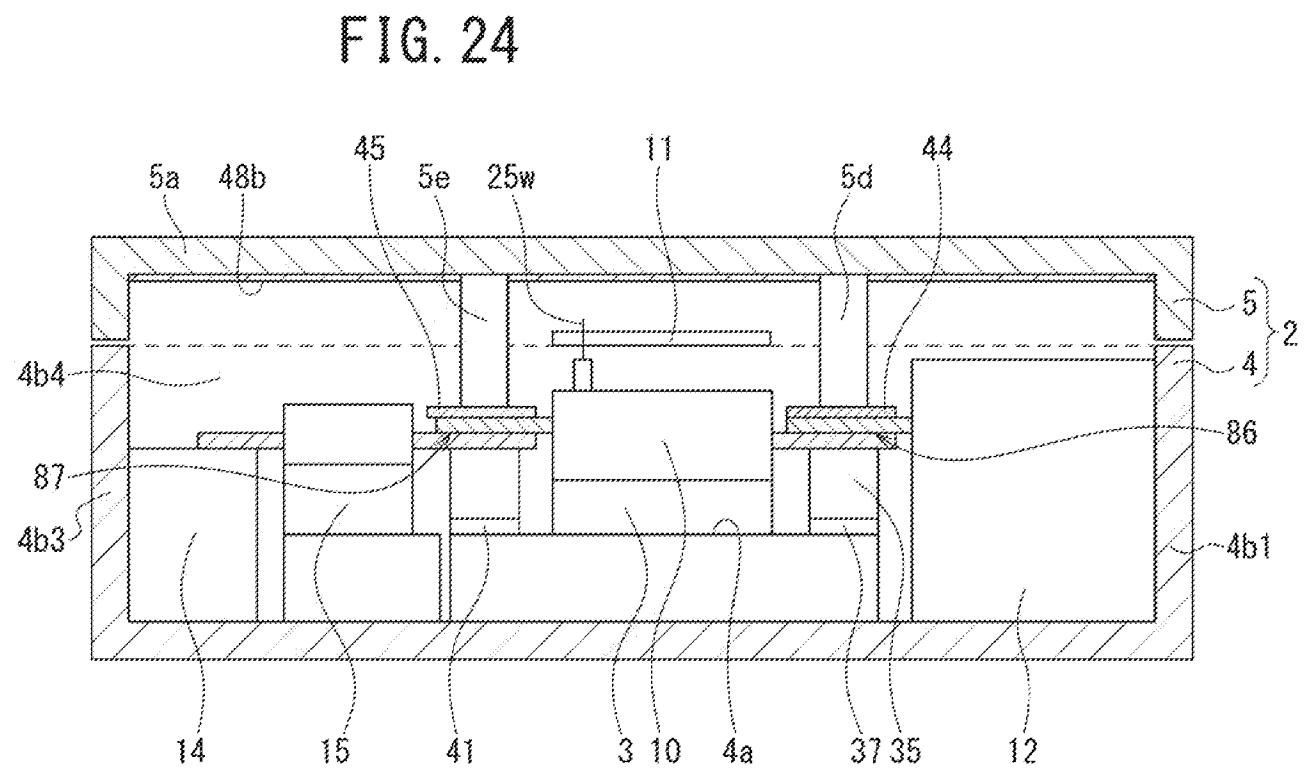

FIG. 24 illustrates a principal part of a power converter according to a third embodiment.

The power converter according to the present embodiment does not employ the fixed plate 47 that is employed in the first embodiment, and by fixing the control circuit board 11 at an end to the second sidewall 4*b*2 and the fourth sidewall 4*b*4 that constitute the enclosure case 4, the control circuit board 11 is arranged above the IGBT module 10. The upper arm lead frames 24U, 24V, 24W and the lower arm lead frames 25U, 25V, 25W that project from the upper face of the IGBT module 10 are inserted into through-holes with lands of the control circuit board 11, and the lead frames and associated through-holes are soldered.

According to the present embodiment, the control circuit board 11 is directly attached to the enclosure case 4 without using the fixed plate 47, thereby enabling person-hours for assembly operations to be reduced and further enabling the production cost of the power converter 1 to be reduced.

[Power Converter According to Fourth Embodiment]

Figure 25:
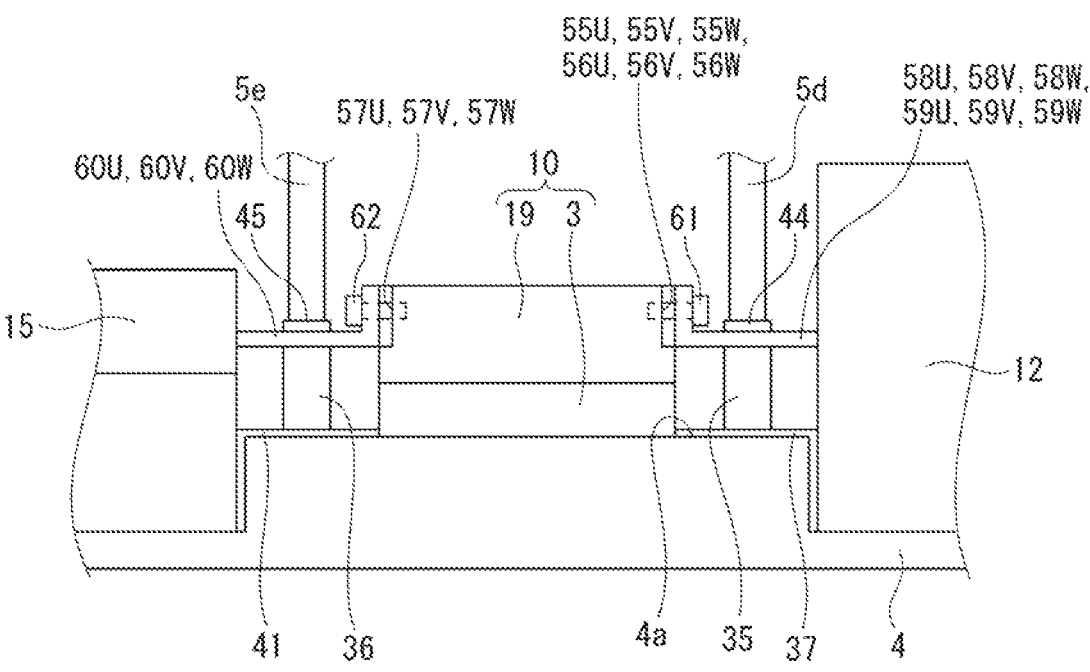
FIG. 25 is a diagram illustrating a connection between a cooler of a power semiconductor module according to a fourth embodiment of the present invention and a cooling water circulation unit.

FIG. 25 illustrates a principal part of a power converter according to a fourth embodiment.

In the IGBT module 10 of the fourth embodiment, threaded hole positive-side terminals 55U, 55V, 55W and threaded hole negative-side terminals 56U, 56V, 56W are provided on one side face of the module main unit 19 in a longitudinal direction at a predetermined interval and threaded hole output terminals 57U, 57V, 57W are provided on the other side face of the module main unit 19 in the longitudinal direction at a predetermined interval.

In the smoothing capacitor 12, plate-shaped positive-side output terminals 58U, 58V, 58W and plate-shaped negative-side output terminals 59U, 59V, 59W, end portions of which are bent at right angle, are provided on one side face of the smoothing capacitor 12 in the longitudinal direction.

In the current detector 15, plate-shaped detector busbars 60U, 60V, 60W, end portions of which are bent at right angle, are provided.

By inserting fixing screws 61 through through-holes formed in the end portions of the positive-side output terminals 58U, 58V, 58W and the negative-side output terminals 59U, 59V, 59W of the smoothing capacitor 12 and screwing the fixing screws 61 into the threaded hole positive-side terminals 55U, 55V, 55W and the threaded hole negative-side terminals 56U, 56V, 56W of the IGBT module 10, the positive-side output terminals 58U, 58V, 58W and the negative-side output terminals 59U, 59V, 59W are electrically connected to the threaded hole positive-side terminals 55U, 55V, 55W and the threaded hole negative-side terminals 56U, 56V, 56W. Undersides of these electrically connected portions thermally contact the cooling terminals 39 of the cooling terminal block 35.

By inserting fixing screws 62 through through-holes formed in the end portions of the detector busbars 60U, 60V, 60W of the current detector 15 and screwing the fixing screws 62 into the threaded hole output terminals 57U, 57V, 57W of the IGBT module 10, the threaded hole output terminals 57U, 57V, 57W are electrically connected to the detector busbars 60U, 60V, 60W. Undersides of these electrically connected portions thermally contact the cooling terminals 42 of the cooling terminal block 36.

Further, by fixing the enclosure cover 5 to the enclosure case 4, the first protruding ridge 5*d* projecting from the top wall 5*a* of the enclosure cover 5 presses the positive-side output terminals 58U, 58V, 58W and the negative-side output terminals 59U, 59V, 59W to the cooling terminal block 35 through the resin sheet 44. The second protruding ridge 5*e* of the enclosure cover 5 also presses the detector busbars 60U, 60V, 60W to the cooling terminal block 36 through the resin sheet 45. The capacitor terminals excluding first through-holes according to the present invention correspond to the positive-side output terminals 58U, 58V, 58W and the negative-side output terminals 59U, 59V, 59W and output unit terminals excluding second through-holes according to the present invention correspond to the detector busbars 60U, 60V, 60W.

In the power converter according to the fourth embodiment, the terminals that connect the IGBT module 10 to the smoothing capacitor 12 and the terminals that connect the IGBT module 10 to the current detector 15 can be easily fixed by screwing using the fixing screws 61 and 62.

Further, since the first protruding ridge 5*d* of the enclosure cover 5 presses the connecting portions of the smoothing capacitor 12 (the positive-side output terminals 58U, 58V, 58W and the negative-side output terminals 59U, 59V, 59W) to the cooling terminal block 35 and the second protruding ridge 5*e* of the enclosure cover 5 presses the connecting portions of the current detector 15 (the detector busbars 60U, 60V, 60W) to the cooling terminal block 36, heat conduction from the connecting portions of the smoothing capacitor 12 to the cooling terminal block 35 and heat conduction from the connecting portions of the current detector 15 to the cooling terminal block 36 are improved, thereby enabling efficient cooling of the connecting portions of the smoothing capacitor 12 and the connecting portions of the current detector 15.

The threaded hole positive-side terminals 55U, 55V, 55W and the threaded hole negative-side terminals 56U, 56V, 56W of the IGBT module 10 may have a plate shape the end portion of which is bent at right angle. In this case, the positive-side output terminals 58U, 58V, 58W and the negative-side output terminals 590, 59V, 59W of the smoothing capacitor 12 are provided on a side face of the smoothing capacitor 12 in the longitudinal direction and the detector busbars 60U, 60V, 60W of the current detector 15 are provided on a side face of the current detector 15. Therefore, the first protruding ridge 5*d* of the enclosure cover 5 and the second protruding ridge 5*e* of the enclosure cover 5 respectively press the threaded hole positive-side terminals 55U, 55V, 55W and the threaded hole negative-side terminals 56U, 56V, 56W of the IGBT module 10 to the cooling terminal blocks 35 and 36.

The threaded hole positive-side terminals 55U, 55V, 55W and the threaded hole negative-side terminals 56U, 56V, 56W of the IGBT module 10 may be provided on an upper face of the module main unit 19 alongside one side face of the module main unit 19 in the longitudinal direction and the threaded hole output terminals 57U, 57V, 57W may be provided on the upper face of the module main unit 19 alongside the other side face of the module main unit 19 in the longitudinal direction. In this case, the end portions of the positive-side output terminals 58U, 58V, 58W and the negative-side output terminals 59U, 59V, 59W of the smoothing capacitor 12 and the end portions of the detector busbars 60U, 60V, 60W of the current detector 15 are not bent.

[Power Converter According to Fifth Embodiment]

Figure 26:
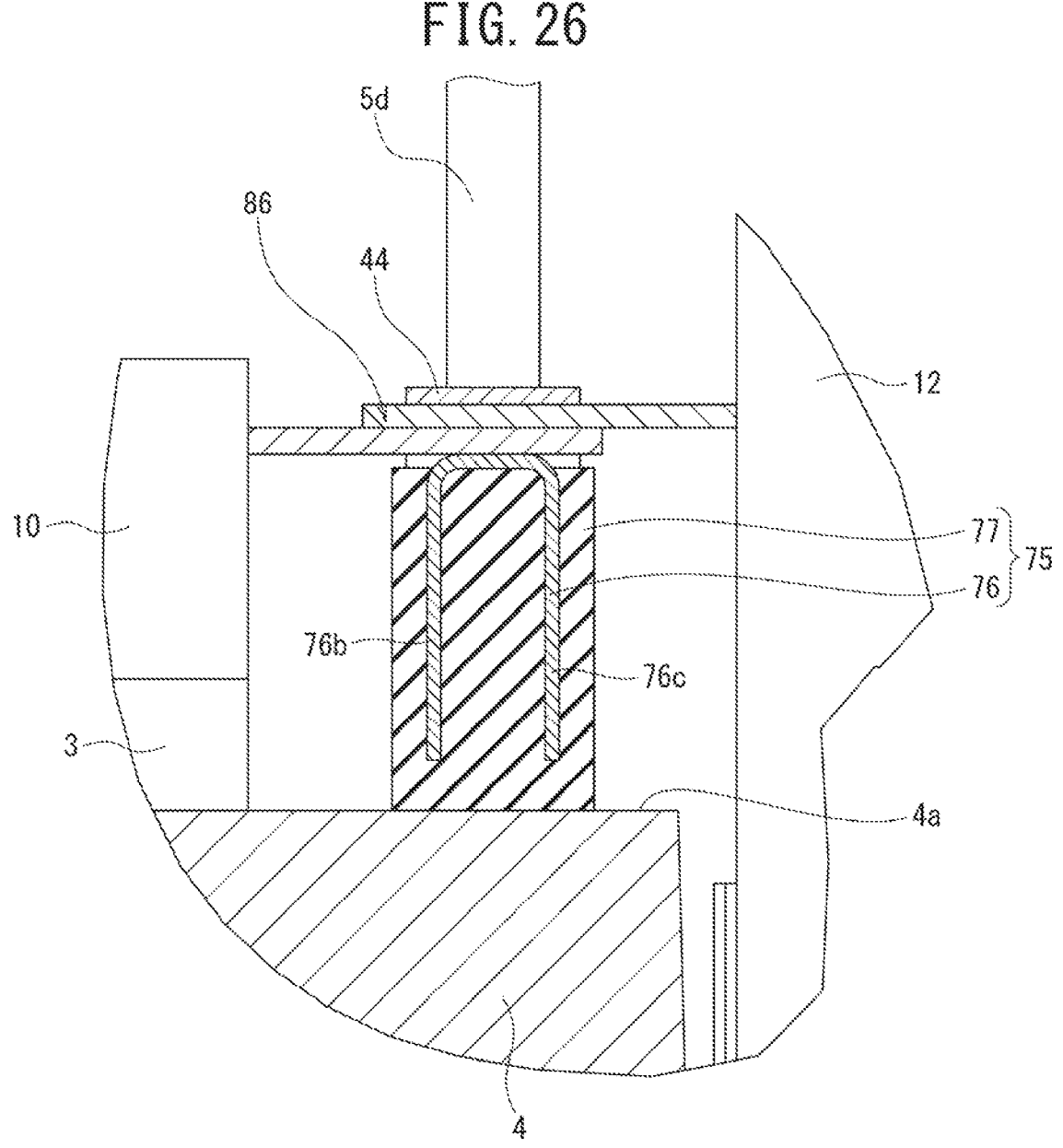
FIG. 26 is a diagram illustrating an electrically connected portion of a power converter according to a fifth embodiment of the present invention.

FIG. 26 illustrates a principal part of a power converter according to a fifth embodiment.

The undersides of the first electrically connected portions 86 (electrically connected portions formed by connecting the positive-side output terminals 26U, 26V, 26W and the negative-side output terminals 27U, 27V, 27W of the smoothing capacitor 12 to the positive-side terminals 21U, 21V, 21W and the negative-side terminals 22U, 22V, 22W of the IGBT module 10 by welding) are in contact with a cooling terminal block 75 of the fifth embodiment.

The cooling terminal block 75 is a member fixed to the bottom wall 4a at opposite ends in a longitudinal direction thereof with fixing screws 38, similarly to the cooling terminal blocks 35 and 36 of the first embodiment.

The cooling terminal block 75 is made of brass having good heat conductivity and includes six cooling terminals 76 each cross section of which is a U-shape and a terminal block main body 77 that is made of a thermoplastic resin by insert-molding the cooling terminals 76 arranged at a predetermined interval in a longitudinal direction.

Each of the six cooling terminals 76 is inversely arranged (inverse U-shaped) in such a way that a flat portion 76a is exposed on the outside of an upper face of the terminal block main body 77 and a pair of opposed portions 76b and 76c are embedded in the terminal block main body 77.

According to the fifth embodiment, when the first electrically connected portions 86 of the IGBT module 10 and the smoothing capacitor 12 generate heat, the heat is conducted from the cooling terminals 76 of the cooling terminal block 75 through the terminal block main body 77 to the bottom wall 4a of the enclosure case 4. Since the inflow flow channel 18a and the outflow flow channel 18b of the cooling water circulation unit CL are formed in the bottom wall 4a and the cooling water circulates therein, the heat radiation performance of the bottom wall 4a is high. Thus, the connecting portions of the IGBT module 10 and the smoothing capacitor 12 can be efficiently cooled.

Further, since the first protruding ridge 5d of the enclosure cover 5 presses the first electrically connected portions 86 to the cooling terminal block 75, the first electrically connected portions 86 are in close contact with the cooling terminal block 75 and heat conduction from the first electrically connected portions 86 to the cooling terminal block 75 is improved, thereby enabling efficient cooling of the first electrically connected portions 86.

[Power Converter According to Sixth Embodiment]

Figure 27:
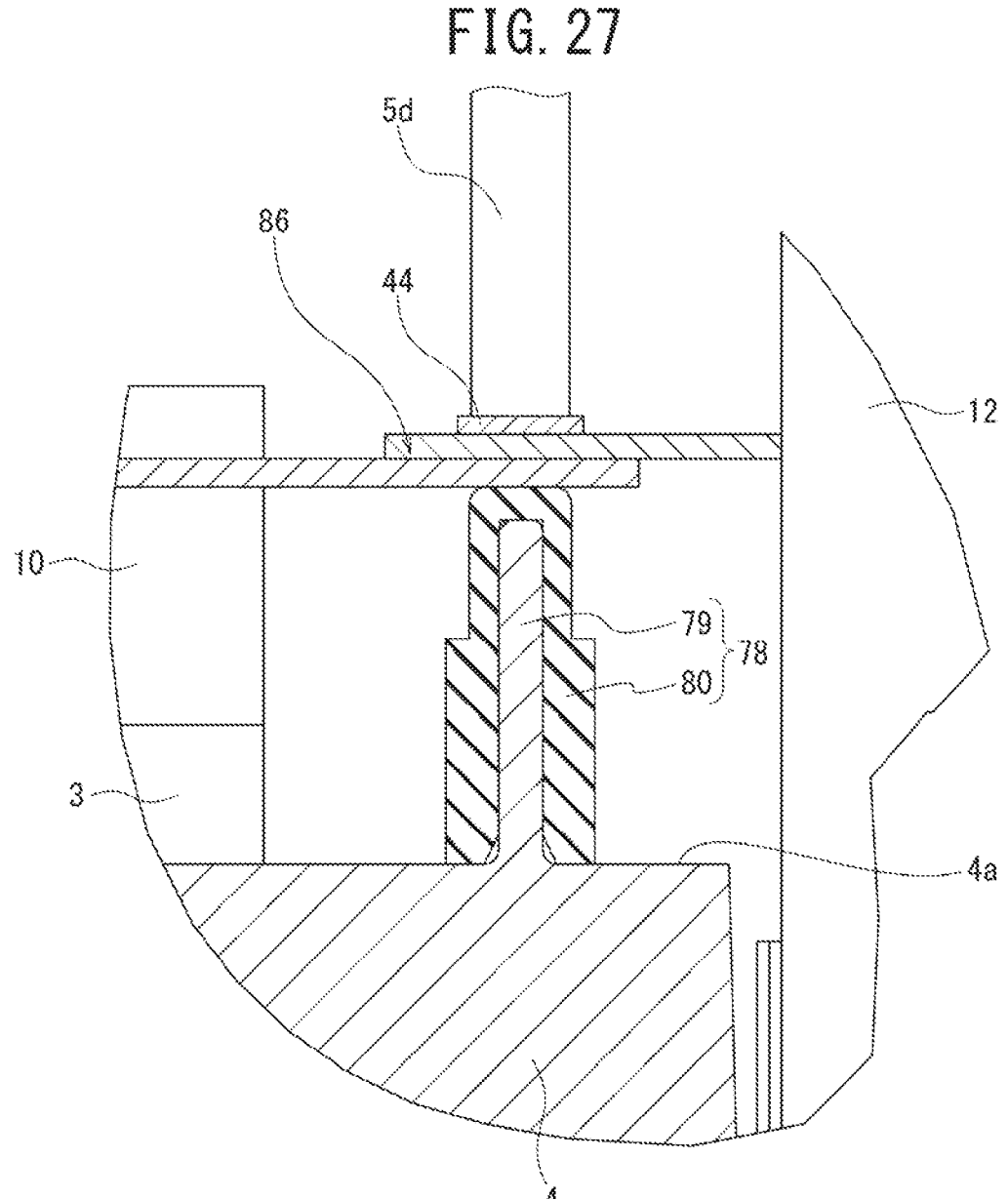
FIG. 27 is a diagram illustrating an electrically connected portion of a power converter according to a sixth embodiment of the present invention.

FIG. 27 illustrates a principal part of a power converter according to a sixth embodiment.

The cooling terminal block 78 of the sixth embodiment is a member that is provided under the underside of the first electrically connected portions 86 of the IGBT module 10 and the smoothing capacitor 12 and that extends in a longitudinal direction thereof, similarly to the fourth embodiment.

The cooling terminal block 78 includes an elongated rising portion 79 that projects from the bottom wall 4a of the enclosure case 4 and an elongated insulating cover 80 made of a synthetic resin that covers the entire rising portion 79.

In the cooling terminal block 78 of the sixth embodiment, when the first electrically connected portions 86 of the IGBT module 10 and the smoothing capacitor 12 generate heat, the heat is conducted to the rising portion 79 through the insulating cover 80 of the cooling terminal block 78. Since the inflow flow channel 18a and the outflow flow channel 18b of the cooling water circulation unit CL are formed in the bottom wall 4a and the cooling water circulates therein, the heat radiation performance of the bottom wall 4a is high. Thus, the connecting portions of the IGBT module 10 and the smoothing capacitor 12 can be efficiently cooled.

In addition, since the first protruding ridge 5d of the enclosure cover 5 presses the first electrically connected portions 86 to the cooling terminal block 78, the first electrically connected portions 86 are in close contact with the cooling terminal block 78 and heat conduction from the first electrically connected portions 86 to the cooling terminal block 78 is improved, thereby enabling efficient cooling of the first electrically connected portions 86.

[Power Converter According to Seventh Embodiment]

Figure 28:
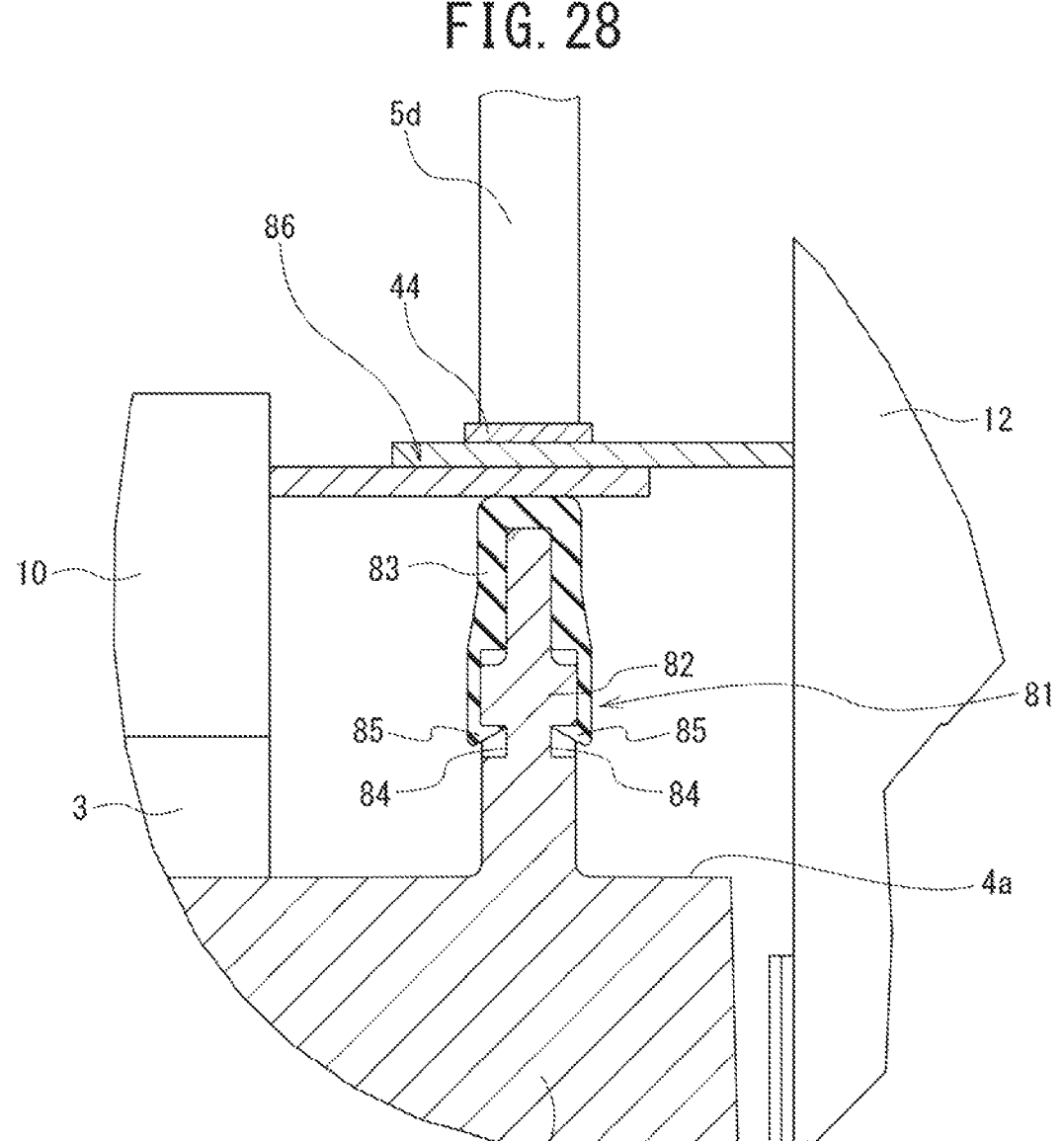
FIG. 28 is a diagram illustrating an electrically connected portion of a power converter according to a seventh embodiment of the present invention.

FIG. 28 illustrates a principal part of a power converter according to a seventh embodiment.

The cooling terminal block 81 of the seventh embodiment is also a member that is provided under the underside of the first electrically connected portions 86 of the IGBT module 10 and the smoothing capacitor 12 and that extends in a longitudinal direction thereof.

The cooling terminal block 81 includes a rising portion 82 that projects from the bottom wall 4a of the enclosure case 4 and an insulating cover 83 made of a synthetic resin that covers an upper periphery of the rising portion 82.

On a proximal side of the rising portion 82 in the longitudinal direction, an engaging concave portion 84 is formed at a substantially middle position in the height direction.

At a proximal end of the insulating cover 83 in the longitudinal direction, a snap-fit portion 85 is formed. By elastically deforming and engaging the snap-fit portion 85 with the engaging concave portion 84, the insulating cover 83 is applied on the upper periphery of the rising portion 82.

According to the seventh embodiment, when the first electrically connected portions 86 of the IGBT module 10 and the smoothing capacitor 12 generate heat, the heat is conducted to the rising portion 82 through the insulating cover 83 of the cooling terminal block 81. Since the inflow flow channel 18a and the outflow flow channel 18b of the cooling water circulation unit CL are formed in the bottom wall 4a and the cooling water circulates therein, the heat radiation performance of the bottom wall 4a is high. Thus, the first electrically connected portions 86 of the IGBT module 10 and the smoothing capacitor 12 can be efficiently cooled.

Further, the cooling terminal block 81 of the seventh embodiment can be constructed with a simple operation of putting the elongated insulating cover 83 on the elongated rising portion 82 that projects from the bottom wall 4a of the enclosure case 4 using the snap-fit portion 85, enabling the production cost to be reduced.

Furthermore, since the first protruding ridge 5d of the enclosure cover 5 presses the first electrically connected portions 86 to the cooling terminal block 81, the first electrically connected portions 86 are in close contact with the cooling terminal block 81 and heat conduction from the first electrically connected portions 86 to the cooling terminal block 81 is improved, thereby enabling efficient cooling of the first electrically connected portions 86.

It should be noted that although description has been made on the cooling terminal blocks 75, 78, 81 that contact the first electrically connected portions 86 of the IGBT module 10 and the smoothing capacitor 12 in the fifth embodiment to the seventh embodiment, the same effect can be achieved for the second electrically connected portions 87 of the IGBT module 10 and the current detector 15.

REFERENCE SIGNS LIST

1 Power converter
2 Enclosure
3 Cooler
3a Bottom wall
3e Inflow opening
3f Outflow opening
4 Enclosure case
4a Bottom wall
4b1 to 4b4 First sidewall to fourth sidewall
4c Opening
4e External input connecting port
4f External output connecting port
5 Enclosure cover
5a Top wall
5b1 to 5b4 First sidewall to fourth sidewall
5c Opening
5d First protruding ridge
5d1 First elastic pressing portion
5d2 Thinned-out portion
5d3 Abutting portion
5e Second protruding ridge
5e1 Second elastic pressing portion
5e2 Thinned-out portion
5e3 Abutting portion
6a Cooling water supply pipe
6b Cooling water discharging pipe
7a Inflow slot
7b Outflow slot
8a Communication channel
8b Communication channel
9a Inflow opening
9a1 Circumferential groove
9b Outflow opening
10 IGBT module
11 Control circuit board
12 Smoothing capacitor
12a Capacitor main body
12b Side face
13 DC input connector
13a Input connector main body
14 AC output connector
15 Current detector
16 O-ring
17 Flow channel cover
18a Inflow flow channel
18b Outflow flow channel
19 Module main unit
19a Resin package
20a One side face
20b The other side face
21U, 21V, 21W Positive-side terminal
22U, 22V, 22W Negative-side terminal
23U, 23V, 23W Output terminal
24U, 24V, 24W Upper arm lead frame
25U, 25V, 25W Lower arm lead frame Positive-side output terminal 26U, 26V, 26W
27U, 27V, 27W Negative-side output terminal
28 Positive-side input terminal
28a Plate-shaped base
28b Connecting portion
29 Negative-side input terminal
30 Positive-side busbar
31 Negative-side busbar
30a Capacitor connecting terminal
30b External input connecting terminal
31a Capacitor connecting terminal
31b External input connecting terminal
32 Detector main body
33U, 33V, 33W Detector busbar
33Ua, 33Va, 33Wa IGBT connecting terminal
33Ub, 33Vb, 33Wb Output terminal
34a, 34b, 34c Mounting hole
35, 36 Cooling terminal block
37, 41 Heat-transfer sheet
38 Fixing screw
39, 42 Cooling terminal
39a, 42a Diameter-reduced portion
40, 43 Terminal block main body
44, 45, 46 Resin sheet
47 Fixed plate
47a Board supporting member
48a, 48b Insulating paper
49 Metal plate
50 Covered portion
50a, 50b, 50c Protrusion
51 Lead frame through-hole
55U, 55V, 55W Threaded hole positive-side terminal
56U, 56V, 56W Threaded hole negative-side terminal
57U, 57V, 57W Threaded hole output terminal
58U, 58V, 58W Positive-side output terminal
59U, 59V, 59W Negative-side output terminal
60U, 60V, 60W Detector busbar
61, 62 Fixing screw
71a Inflow pipe
71b Outflow pipe
72 O-ring
75 Cooling terminal block
76 Cooling terminal
77 Terminal block main body
76a Flat portion
76b, 76c pair of opposed portions
78 Cooling terminal block
79 Rising portion
80 Insulating cover
81 Cooling terminal block
82 Rising portion
83 Insulating cover
84 Engaging concave portion
85 Snap-fit portion
86 First electrically connected portion
87 Second electrically connected portion
CL Cooling water circulation unit
S1 First storage space
S2 Second storage space
S3 Third storage space
S4 Fourth storage space
The invention claimed is:

1. A power converter, comprising:
an enclosure case in which a cooling medium flow channel for a cooling medium to flow through is formed inside, the enclosure case including an opening in an upper portion;

a power semiconductor module housed in the enclosure case in such a way as to be in close contact with an inner wall of the enclosure case on the side of the cooling medium flow channel;

a smoothing capacitor and an AC output unit being electrically connected to the power semiconductor module and housed in the enclosure case; and an enclosure cover fixed to a periphery of the opening at the upper portion of the enclosure case in such a way as to cover the power semiconductor module, the smoothing capacitor, and the AC output unit and configured to form an enclosure, wherein at least one of a plurality of first electrically connected portions configured to electrically connect the power semiconductor module to the smoothing capacitor and a plurality of second electrically connected portions configured to electrically connect the power semiconductor module to the AC output unit is thermally connected to the inner wall on the side of the cooling medium flow channel via a cooling terminal block, and convex portions configured to press the plurality of first electrically connected portions and the plurality of second electrically connected portions to the cooling terminal block are formed in an inner wall of the enclosure cover.

2. The power converter according to claim 1, wherein a control board configured to drive and control the power semiconductor module is arranged in such a way as to cover the power semiconductor module.

3. The power converter according to claim 2, wherein a fixed plate fixed to the enclosure and configured to support the control board is arranged between the power semiconductor module and the control board, and the fixed plate is shaped in such a way as to cover a portion of the power semiconductor module and a control pin projecting upward from the power semiconductor module passes outside the fixed plate and is connected to the control board.

4. The power converter according to claim 2, wherein the control board is directly fixed to the enclosure case.

5. The power converter according to claim 1, wherein in the convex portions, an elastic pressing portion configured to elastically press the plurality of first electrically connected portions or the plurality of second electrically connected portions to the cooling terminal block is formed.

6. The power converter according to claim 1, wherein the cooling terminal block includes:

a terminal block main body made of a resin and fixed to the inner wall on the side of the cooling medium flow channel; and a plurality of cooling terminals made of metal, the cooling terminals being embedded in the terminal block main body and arranged at a predetermined interval in such a way that opposite ends of the cooling terminals are exposed to the outside, wherein one ends of the plurality of cooling terminals are in contact with the first electrically connected portion and the second electrically connected portion and the other ends are in contact with the enclosure through an electrically insulating heat-transfer sheet.

7. The power converter according to claim 1, wherein the cooling terminal block includes:

a terminal block main body made of a resin and fixed to the inner wall on the side of the cooling medium flow channel; and a plurality of cooling terminals made of metal, the cooling terminals being embedded in the terminal block main body and arranged at a predetermined interval in such a way that one end of each of the cooling terminals projects outward and the other end does not project outward, wherein the one ends of the plurality of cooling terminals are in contact with the first electrically connected portion and the second electrically connected portion and the other end is in contact with the enclosure.

8. The power converter according to claim 1, wherein the cooling terminal block includes:

a rising portion rising from a portion of the enclosure case toward the first electrically connected portions or the second electrically connected portions, and an insulating cover fixed to the enclosure in such a way as to cover an upper portion of the rising portion, the insulating cover being in contact with one of the first electrically connected portions and the second electrically connected portions.

9. The power converter according to claim 1, wherein the power semiconductor module includes a plate-shaped first module terminal projecting from one side face of a module main unit and a plurality of plate-shaped second module terminals projecting from the other side face of the module main unit, the smoothing capacitor includes a plurality of plate-shaped capacitor terminals projecting from a capacitor main body, the AC output unit includes a plurality of plate-shaped output unit terminals projecting from an output unit main body, each of the first electrically connected portions is formed by joining one of the first module terminals and associated one of the capacitor terminals, and each of the second electrically connected portions is formed by joining one of the second module terminal and associated one of the output unit terminals.

10. The power converter according to claim 1, wherein the AC output unit is housed side by side with the power semiconductor module in a direction perpendicular to a longitudinal direction of the smoothing capacitor.

11. A power converter, comprising:

an enclosure case in which a cooling medium flow channel for a cooling medium to flow through is formed inside, the enclosure case including an opening in an upper portion;

a power semiconductor module housed in the enclosure case in such a way as to be in close contact with an inner wall of the enclosure case on the side of the cooling medium flow channel;

a smoothing capacitor and an AC output unit being electrically connected to the power semiconductor module and housed in the enclosure case; and an enclosure cover fixed to a periphery of the opening in the upper portion of the enclosure case in such a way as to cover the power semiconductor module, the smoothing capacitor, and the AC output unit and configured to form an enclosure, wherein the power semiconductor module includes a plurality of first threaded hole terminals provided on one side face of a module main unit and a plurality of second threaded hole terminals provided on the other side face of the module main unit, the smoothing capacitor includes a plurality of plate-shaped capacitor terminals projecting from a capacitor main body and first through-holes formed in the capacitor terminals, the AC output unit includes a plurality of plate-shaped output unit terminals projecting from an output unit main body and second through-holes formed in the output unit terminals, the power converter includes a plurality of first electrically connected portions configured to electrically connect the power semiconductor module to the smoothing capacitor and a plurality of second electrically connected portions configured to electrically connect the power semiconductor module to the AC output unit, each of the first electrically connected portions is formed by connecting one of the first threaded hole terminals to associated one of the capacitor terminals by inserting a first screw through the first through-hole of the associated one of the capacitor terminals and screwing the first screw into the one of the first threaded hole terminals, each of the second electrically connected portions is formed by connecting one of the second threaded hole terminals to associated one of the output unit terminals by inserting a second screw through the second through-hole of the associated one of the output unit terminals and screwing the second screw into the one of the second threaded hole terminals, and convex portions are formed in an inner wall of the enclosure cover, the convex portions configured to press portions of the capacitor connecting terminal excluding the first through-hole and portions of the output unit terminals excluding the second through-hole to a cooling terminal block thermally connected to the inner wall on the side of the cooling medium flow channel.

* * * * *